(12) United States Patent
Roh

(10) Patent No.: US 10,734,045 B2
(45) Date of Patent: Aug. 4, 2020

(54) MEMORY SYSTEM CAPABLE OF PERFORMING A DATA CLOCK CALIBRATION OPERATION

(71) Applicant: SK hynix Inc., Gyeonggi-do (KR)

(72) Inventor: Young-Dong Roh, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/396,215

(22) Filed: Apr. 26, 2019

(65) Prior Publication Data

US 2019/0252012 A1 Aug. 15, 2019

Related U.S. Application Data

(63) Continuation of application No. 15/832,127, filed on Dec. 5, 2017, now Pat. No. 10,311,925.

(30) Foreign Application Priority Data

Apr. 21, 2017 (KR) .......................... 10-2017-0051359

(51) Int. Cl.

| | |
|---|---|
| *G11C 7/22* | (2006.01) |
| *G11C 7/06* | (2006.01) |
| *G11C 8/06* | (2006.01) |
| *G06F 3/06* | (2006.01) |
| *G11C 8/18* | (2006.01) |

(Continued)

(52) U.S. Cl.
CPC ............ *G11C 7/222* (2013.01); *G06F 3/0614* (2013.01); *G06F 3/0629* (2013.01); *G06F 3/0659* (2013.01); *G11C 7/062* (2013.01); *G11C 8/06* (2013.01); *G11C 8/18* (2013.01); *G11C 29/023* (2013.01); *G11C 29/028* (2013.01); *G11C 29/36* (2013.01); *G11C 29/52* (2013.01); *G11C 7/1072* (2013.01); *G11C 2207/2254* (2013.01)

(58) Field of Classification Search
CPC ....... G11C 7/222; G11C 7/062; G11C 7/1072; G11C 8/06; G11C 8/18; G11C 2207/2254; G06F 3/0614; G06F 3/0629; G06F 3/0659

See application file for complete search history.

(56) References Cited

U.S. PATENT DOCUMENTS 8,565,033 B1 * 10/2013 Manohararajah .... G11C 29/028
365/129
9,811,273 B1 * 11/2017 Brahmadathan ...... G06F 3/0619
(Continued)

*Primary Examiner* — Mushfique Siddique
(74) *Attorney, Agent, or Firm* — IP & T Group LLP

(57) ABSTRACT

A memory system may include: a controller suitable for: generating a first clock and first pattern data having a first phase difference, in a write calibration mode, calibrating, the first phase difference depending on a second information, in a read calibration mode, detecting, a first and second value of the first and second pattern data according to the first and second clock, generating, a first information according to comparing of the first and second values, receiving by calibrating, a second phase difference generated by a memory device depending on the first information; and the memory device suitable for: generating the second clock and the second pattern data having the second phase difference, in the write calibration mode, detecting, a first and second value of the first and second pattern data according to the first and second clock, generating, the second information according to comparing of the first and second values.

20 Claims, 12 Drawing Sheets

(51) Int. Cl.
  *G11C 29/02*  (2006.01)
  *G11C 29/36*  (2006.01)
  *G11C 29/52*  (2006.01)
  *G11C 7/10*   (2006.01)

(56) References Cited

U.S. PATENT DOCUMENTS

| | | | |
|---|---|---|---|
| 2010/0005281 A1* | 1/2010 | Buchmann | G06F 13/4243 |
| | | | 713/2 |
| 2010/0180143 A1* | 7/2010 | Ware | G11C 8/18 |
| | | | 713/600 |
| 2010/0309744 A1* | 12/2010 | Park | G06F 13/1689 |
| | | | 365/233.11 |
| 2012/0087194 A1* | 4/2012 | Oh | G11C 7/1087 |
| | | | 365/189.16 |
| 2012/0250433 A1* | 10/2012 | Jeon | G11C 8/18 |
| | | | 365/193 |
| 2013/0346721 A1* | 12/2013 | Giovannini | G11C 7/222 |
| | | | 711/167 |

* cited by examiner

MEMORY SYSTEM CAPABLE OF PERFORMING A DATA CLOCK CALIBRATION OPERATION

CROSS-REFERENCE TO RELATED APPLICATION

This application is a continuation of U.S. patent application Ser. No. 15/832,127 filed on Dec. 5, 2017 which claims benefits of priority of Korean Patent Application No. 10-2017-0051359 filed on Apr. 21, 2017. The disclosure of each of the foregoing application is incorporated herein by reference in its entirety.

TECHNICAL FIELD

Exemplary embodiments relate to a memory system, and more particularly, to a memory system which supports a data clock calibration operation.

DISCUSSION OF THE RELATED ART

The computer environment paradigm has changed to ubiquitous computing systems that can be used anytime and anywhere. Due to this, use of portable electronic devices such as mobile phones, digital cameras, and notebook computers has rapidly increased. These portable electronic devices generally use a memory system having one or more memory devices for storing data. A memory system may be used as a main or an auxiliary storage device of a portable electronic device.

Memory systems provide excellent stability, durability, high information access speed, and low power consumption because they have no moving parts. Examples of memory systems having such advantages include universal serial bus (USB) memory devices, memory cards having various interfaces, and solid state drives (SSD).

SUMMARY

Various embodiments are directed to a memory system capable of performing a data clock calibration operation.

In an embodiment of the present invention memory system is dieted to reduce firmware intervention in the data clock calibration operation.

An embodiment of the present invention is directed to a memory system may include: a controller suitable for: generating a first data clock and first pattern data having a first phase difference, calibrating, in a write calibration mode, the first phase difference depending on a second comparison information, detecting, in a read calibration mode, a first value of the first pattern data according to the first data clock and a second value of a second pattern data according to a second data clock, comparing, in the read calibration mode, the first and second values detected in the read calibration mode, and generating, in the read calibration mode, a first comparison information according to a result of the comparing of the first and second values detected in the read calibration mode, and receiving by calibrating, in the read calibration mode, a second phase difference generated by a memory device depending on the first comparison information; and the memory device suitable for: generating the second data clock and the second pattern data having the second phase difference, detecting, in the write calibration mode, a first value of the first pattern data according to the first data clock and a second value of second pattern data according to the second data clock, comparing, in the write calibration mode, the first and second values detected in the write calibration mode, and generating, in the write calibration mode, the second comparison information according to a result of the comparing of the first and second values detected in the write calibration mode.

The controller may include: a first generation unit suitable for: generating the first data clock and the first pattern data, and calibrating, in the write calibration mode, the first phase difference depending on the second comparison information; a first comparison unit suitable for: detecting, in the read calibration mode, the first and second values, comparing, in the read calibration mode, the first and second values detected in the read calibration mode, and generating, in the read calibration mode, the first comparison information; and a first calibration unit suitable for receiving by calibrating, in the read calibration mode, the second phase difference.

The memory device may include: a second generation unit suitable for generating the second data clock and the second pattern data; and a second comparison unit suitable for: detecting, in the write calibration mode, the first and second values, comparing, in the write calibration mode, the first and second values detected in the write calibration mode, and generating, in the write calibration mode, the second comparison information.

The first pattern data generated by the controller may be the same as the second pattern data generated by the memory device.

The controller may further include a calibration command generation unit suitable for controlling activation of the read calibration mode and the write calibration mode by generating a read calibration command and a write calibration command, respectively.

The calibration command generation unit may generate the read calibration command in response to a read calibration period entered at a first predetermined point of time during a booting operation period and then selects whether to additionally generate the read calibration command, in response to the output signal of the first comparison unit, and may generate the write calibration command in response to a write calibration period entered at a second predetermined point of time and then selects whether to additionally generate the write calibration command, in response to the comparison information.

The controller may further include a determination unit suitable for controlling the calibration command generation unit to generate the read and write calibration commands based on a number of bit flips of normal data read from the memory device in a normal operation period.

The calibration command generation unit may generate the read calibration command and the write calibration command in response to an intermediate calibration period selected in terms of whether to enter, depending on an output signal of the determination unit, is entered during the normal operation period, and then may select whether to generate additionally the read calibration command, in response to the output signal of the first comparison unit, and may select whether to generate additionally the write calibration command, in response to the comparison information.

The determination unit may check whether an idle state of the memory device is retained for at least a predetermined time during the normal operation period, and may select whether the calibration command generation unit will enter the intermediate calibration period, depending on a checking result.

In an embodiment, a memory system may include: a controller suitable for, in a first write calibration mode, generating and outputting a first data clock and first pattern data which are calibrated in a phase difference thereof depending on a first comparison information inputted thereto; in a second write calibration mode, generating and outputting a second data clock and second pattern data which are calibrated in a phase difference thereof depending on a second comparison information inputted thereto; in a first read calibration mode, determining a value of third pattern data inputted thereto based on a third data clock inputted thereto and receiving the third data clock by calibrating a phase of the third data clock depending on a result of comparing the value of the third pattern data with a value of the first pattern data generated therein; and, in a second read calibration mode, determining a value of fourth pattern data inputted thereto based on a fourth data clock inputted thereto and receiving the fourth data clock by calibrating a phase of the fourth data clock depending on a result of comparing the value of the fourth pattern data with a value of the second pattern data generated therein; a first memory device suitable for, in the first write calibration mode, determining a value of the first pattern data inputted thereto based on the first data clock inputted thereto and generating and outputting the first comparison information of which value is determined depending on a result of comparing the value of the first pattern data with a value of the third pattern data generated therein, and, in the first read calibration mode, generating and outputting the third pattern data and the third data clock which have a predetermined phase difference; and a second memory device suitable for, in the second write calibration mode, determining a value of the second pattern data inputted thereto based on the second data clock inputted thereto and generating and outputting the second comparison information of which value is determined depending on a result of comparing the value of the second pattern data with a value of the fourth pattern data generated therein, and, in the second read calibration mode, generating and outputting the fourth pattern data and the fourth data clock which have a predetermined phase difference.

The controller may further include: a first generation unit suitable for, in the first read calibration mode, generating the first pattern data and the first data clock which have the predetermined phase difference; in the second read calibration mode, generating the second pattern data and the second data clock which have the predetermined phase difference; in the first write calibration mode, generating the first data clock and the first pattern data which are calibrated in the phase difference thereof depending on the first comparison information; and, in the second write calibration mode, generating the second data clock and the second pattern data which are calibrated in the phase difference thereof depending on the second comparison information; a first comparison unit suitable for, in the first read calibration mode, comparing the value of the first pattern data determined based on the first data clock and the value of the third pattern data determined based on the third data clock inputted from the first memory device; a second comparison unit suitable for, in the second read calibration mode, comparing the value of the second pattern data determined based on the second data clock and the value of the fourth pattern data determined based on the fourth data clock inputted from the second memory device; a first calibration unit suitable for, in the first read calibration mode, receiving the third data clock by calibrating the phase of the third data clock in response to an output signal of the first comparison unit such that the third data clock and the third pattern data are received by being calibrated in a phase difference thereof; and a second calibration unit suitable for, in the second read calibration mode, receiving the fourth data clock by calibrating the phase of the fourth data clock in response to an output signal of the second comparison unit such that the fourth data clock and the fourth pattern data are received by being calibrated in a phase difference thereof.

The first memory device may include: a second generation unit suitable for, in the first read calibration mode and the first write calibration mode, generating the third pattern data and the third data clock which have the predetermined phase difference; and a third comparison unit suitable for, in the first write calibration mode, comparing the value of the third pattern data determined based on the third data clock and the value of the first pattern data determined based on the first data clock inputted from the controller and determining and generating the value of the first comparison information depending on a comparison result.

The second memory device may include: a third generation unit suitable for, in the second read calibration mode and the second write calibration mode, generating the fourth pattern data and the fourth data clock which have the predetermined phase difference; and a fourth comparison unit suitable for, in the second write calibration mode, comparing the value of the fourth pattern data determined based on the fourth data clock and the value of the second pattern data determined based on the second data clock inputted from the controller and determining and generating the value of the second comparison information depending on a comparison result.

The value of the first pattern data determined based on the first data clock generated in the first generation unit of the controller and the value of the third pattern data determined based on the third data clock generated in the second generation unit of the first memory device may be the same with each other, and the value of the second pattern data determined based on the second data clock generated in the first generation unit of the controller and the value of the fourth pattern data determined based on the fourth data clock generated in the third generation unit of the second memory device may be the same with each other.

The controller may further include: a calibration command generation unit suitable for generating a first read calibration command for controlling entry to the first read calibration mode, generating a second read calibration command for controlling entry to the second read calibration mode, generating a first write calibration command for controlling entry to the first write calibration mode, and generating a second write calibration command for controlling entry to the second write calibration mode.

The calibration command generation unit may generate the first and second read calibration commands in response to that a read calibration period is entered at a first predetermined time point during a booting operation period, and then may select whether to additionally generate the first read calibration command, in response to the output signal of the first comparison unit, and may select whether to additionally generate the second read calibration command, in response to the output signal of the second comparison unit, and the calibration command generation unit may generate the first and second write calibration commands in response to that a write calibration period is entered at a second predetermined time point, and then may select whether to additionally generate the first write calibration command, in response to the first comparison information, and may select whether to additionally generate the second write calibration command, in response to the second comparison information.

The controller may further include: a first determination unit suitable for determining whether the number of bit flips of data inputted from the first memory device in a normal operation period exceeds a predetermined reference; and a second determination unit suitable for determining whether the number of bit flips of data inputted from the second memory device in the normal operation period exceeds the predetermined reference.

The calibration command generation unit may generate the first read calibration command and the first write calibration command in response to that a first intermediate calibration period selected in terms of whether to enter, depending on an output signal of the first determination unit, is entered during the normal operation period, and then may select whether to generate additionally the first read calibration command, in response to the output signal of the first comparison unit, and may select whether to generate additionally the first write calibration command, in response to the first comparison information, and the calibration command generation unit may generate the second read calibration command and the second write calibration command in response to that a second intermediate calibration period selected in terms of whether to enter, depending on an output signal of the second determination unit, is entered during the normal operation period, and then may select whether to generate additionally the second read calibration command, in response to the output signal of the second comparison unit, and may select whether to generate additionally the second write calibration command, in response to the second comparison information.

The first determination unit may check whether an idle state of the first memory device is retained for at least a predetermined time during the normal operation period, and may select whether the calibration command generation unit will enter the first intermediate calibration period, depending on a checking result, and the second determination unit may check whether an idle state of the second memory device is retained for at least the predetermined time during the normal operation period, and may select whether the calibration command generation unit will enter the second intermediate calibration period, depending on a checking result.

In an embodiment, a method for operating a memory system including a memory device and a controller for controlling an operation of the memory device, may include: an act of generating memory pattern data and a memory data clock which have a predetermined phase difference, in the memory device under first and second calibration modes; an act of generating controller pattern data and a controller data clock which have a predetermined phase difference, in the controller under the second calibration mode; a first transmission act of, in the first calibration mode, generating, in the controller, the controller data clock and the controller pattern data which are calibrated in a phase difference thereof depending on a comparison information transmitted from the memory device to the controller, and transmitting the controller data clock and the controller pattern data to the memory device; a second transmission act of, in the first calibration mode and after the first transmission act, determining, in the memory device, a value of the controller pattern data based on the controller data clock transmitted from the controller to the memory device, generating the comparison information depending on a result of comparing the determined value of the controller pattern data with a value of the memory pattern data in the memory device, and transmitting the comparison information to the controller; and an act of, in the second calibration mode, determining, in the controller, a value of the first memory pattern data based on the memory data clock transmitted from the memory device to the controller, and receiving the memory data clock transmitted from the memory device to the controller by calibrating a phase of the memory data clock in the controller depending on a result of comparing the determined value of the memory pattern data with a value of the controller pattern data in the controller.

In an embodiment, a non-volatile memory system may include: a controller suitable for: generating a first data clock and first pattern data having a first phase difference, and calibrating the first phase difference depending on a second comparison information; and a memory device suitable for: generating a second data clock and second pattern data having a second phase difference, detecting a first value of the first pattern data according to the first data clock and a second value of second pattern data according to the second data clock, comparing the first and second values, and generating the second comparison information according to a result of the comparing of the first and second values, the first pattern data generated by the controller may be the same as the second pattern data generated by the memory device.

In an embodiment, a non-volatile memory system may include: a memory device suitable for generating a second data clock and a second pattern data having a second phase difference; and a controller suitable for: generating a first data clock and first pattern data having a first phase difference, detecting a first value of the first pattern data according to the first data clock and the second value of second pattern data according to the second data clock, comparing the first and second values, and receiving by calibrating the second phase difference according to a result of the comparing of the first and second values, the first pattern data generated by the controller may be the same as the second pattern data generated by the memory device.

DETAILED DESCRIPTION

Figure 1:
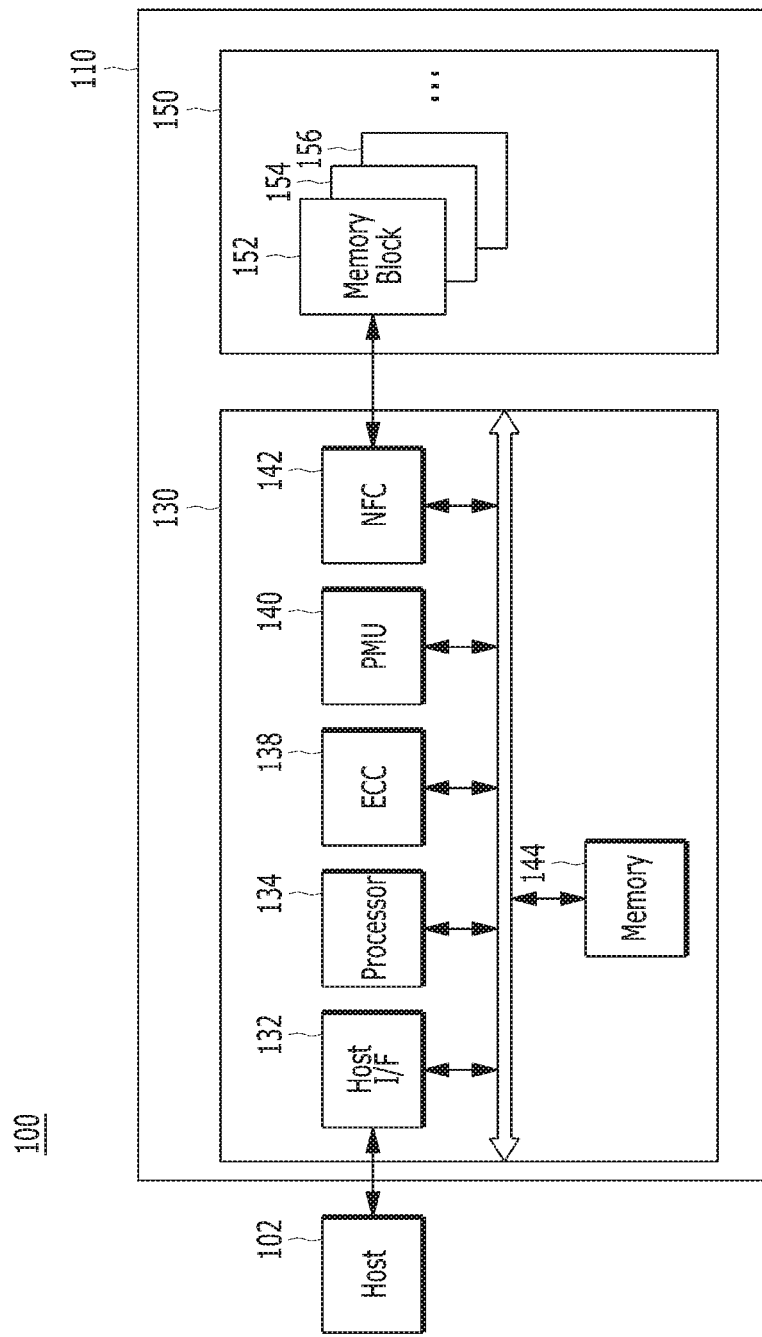
FIG. 1 is a block diagram illustrating a data processing system including a memory system in accordance with an embodiment of the present invention.

Various embodiments of the present invention are described below in more detail with reference to the accompanying drawings. We note, however, that the present invention may be embodied in different other embodiments, forms and variations thereof and should not be construed as being limited to the embodiments set forth herein. Rather, the described embodiments are provided so that this disclosure will be thorough and complete, and will fully convey the present invention to those skilled in the art to which this invention pertains. Throughout the disclosure, like reference numerals refer to like parts throughout the various figures and embodiments of the present invention.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to clearly illustrate features of the embodiments.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the present invention. As used herein, singular forms are intended to include the plural forms as well, unless the context clearly indicates otherwise. It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail n order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

FIG. 1 is a block diagram illustrating a data processing system 100 including a memory system 110, in accordance with an embodiment of the present invention.

Referring to FIG. 1, the data processing system 100 may include a host 102 operatively coupled to the memory system 110.

The host 102 may be an electronic device including a portable electronic device such as a mobile phone, MP3 player and laptop computer or a non-portable electronic device such as a desktop computer, game machine, TV and projector.

The memory system 110 may operate to store data for the host 102 in response to a request of the host 102. Non-limited examples of the memory system 110 may include a solid state drive (SSD), a multi-media card (MMC), a secure digital (SD) card, a universal storage bus (USB) device, a universal flash storage (UFS) device, compact flash (CF) card, a smart media card (SMC), a personal computer memory card international association (PCMCIA) card and memory stick. The MMC may include an embedded MMC (eMMC), reduced size MMC (RS-MMC) and micro-MMC. The SD card may include a mini-SD card and a micro-SD card.

The memory system 110 may be embodied by various types of storage devices. Non-limited examples of storage devices included in the memory system 110 may include volatile memory devices such as a DRAM dynamic random access memory (DRAM) and a static RAM (SRAM) and nonvolatile memory devices such as a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magneto-resistive RAM (MRAM), resistive RAM (RRAM) and a flash memory. The memory system may have a 2- or 3-dimensional (3D) stack structure. For example, the memory system may be a 3D stack structure flash memory. The memory system 110 may include a memory device 150 and a controller 130. The memory device 150 may store data for the host 120, and the controller 130 may control data storage into the memory device 150 and retrieval of the stored data for use by the host.

The controller 130 and the memory device 150 may be integrated into a single semiconductor device, which may be included in the various types of memory systems as exemplified above.

Non-limited application examples of the memory system 110 may include a computer, an Ultra Mobile PC (UMPC), a workstation, a net-book, a Personal Digital Assistant (PDA), a portable computer, a web tablet, a tablet computer, a wireless phone, a mobile phone, a smart phone, an e-book, a Portable Multimedia Player (PMP), a portable game machine, a navigation system, a black box, a digital camera, a Digital Multimedia Broadcasting (DMB) player, a 3-dimensional television, a smart television, a digital audio recorder, a digital audio player, a digital picture recorder, a digital picture player, a digital video recorder, a digital video player, a storage device constituting a data center, a device capable of transmitting/receiving information in a wireless environment, one of various electronic devices constituting a home network, one of various electronic devices constituting a computer network, one of various electronic devices constituting a telematics network, a Radio Frequency Identification (RFID) device, or one of various components constituting a computing system.

The memory device 150 may be a nonvolatile memory device and may retain data stored therein even though power is not supplied. The memory device 150 may store data provided from the host 102 through a write operation, and provide data stored therein to the host 102 through a read operation. The memory device 150 may include a plurality of memory dies (not shown), each memory die including a plurality of planes (not shown), and each plane including a plurality of memory blocks 152 to 156. Each of the memory blocks 152 to 156 may include a plurality of pages, and each of the pages may include a plurality of memory cells coupled to a word line. The memory cells in each of the memory blocks 152 to 156 may be arranged in 2D memory cell arrays. Multiple memory cell arrays may be stacked together to form a 3D memory cell array. It is noted that the architecture of the memory cell array(s) of the memory device may vary according to design and that the present invention is not limited to any particular architecture.

The controller 130 may control the memory device 150 in response to a request from the host 102, including controlling the read, write, program and erase operations of the memory device 150. For example, the controller 130 may control a read operation to provide data read from the memory device 150 to the host 102, or control a write operation to store data provided from the host 102 into the memory device 150.

The controller 130 may include a host interface (I/F) unit 132, a processor 134, an error correction code (ECC) unit 138, a Power Management Unit (PMU) 140, a NAND flash controller (NFC) 142 and a memory 144 all operatively coupled via an internal bus generally designated in FIG. 1 with the wide double headed arrow.

The host interface unit 132 may be configured to process a command and data of the host 102, and may communicate with the host 102 through one or more of various interface protocols such as universal serial bus (USB), multi-media card (MMC), peripheral component interconnect-express (PCI-E), small computer system interface (SCSI), serial-attached SCSI (SAS), serial advanced technology attachment (SATA), parallel advanced technology attachment (PATA), enhanced small disk interface (ESDI) and integrated drive electronics (IDE).

The ECC unit 138 may detect and correct an error contained in the data read from the memory device 150. In other words, the ECC unit 138 may perform an error correction decoding process to the data read from the memory device 150 through an ECC code used during an ECC encoding process. According to a result of the error correction decoding process, the ECC unit 138 may output a signal, for example, an error correction success/fail signal. When the number of error bits is more than a threshold value of correctable error bits, the ECC unit 138 may not correct the error bits, and may output an error correction fail signal.

The ECC unit 138 may perform error correction through a coded modulation such as Low-Density Parity Check (LDPC) code, Bose-Chaudhri-Hocquenghem (BCH) code, turbo code, Reed-Solomon code, convolution code, Recursive Systematic Code (RSC), Trellis-Coded Modulation (TCM) and Block coded modulation (BCM). However, the ECC unit 138 is not limited thereto. The ECC unit 138 may include all circuits, modules, systems or devices for error correction.

The PMU 140 may provide and manage power of the controller 130.

The NFC 142 may serve as a memory/storage interface for interfacing the controller 130 and the memory device 150 such that the controller 130 controls the memory device 150 in response to a request from the host 102. When the memory device 150 is a flash memory or specifically a NAND flash memory, the NFC 142 may generate a control signal for the memory device 150 and process data to be provided to the memory device 150 under the control of the processor 134. The NFC 142 may work as an interface (e.g., a NAND flash interface, also referred to as an NFC controller) for processing a command and data between the controller 130 and the memory device 150. The NFC 142 may support command, and data transfer between the controller 130 and the memory device 150.

The memory 144 may serve as a working memory of the memory system 110 and the controller 130, and store data for driving the memory system 110 and the controller 130. The controller 130 may control the memory device 150 to perform read, write, program and erase operations in response to a request from the host 102. The controller 130 may provide data read from the memory device 150 to the host 102, may store data provided from the host 102 into the memory device 150. The memory 144 may store data required for the controller 130 and the memory device 150 to perform these operations.

The memory 144 may be embodied by a volatile memory. For example, the memory 144 may be embodied by static random access memory (SRAM) or dynamic random access memory (DRAM). The memory 144 may be disposed within or out of the controller 130. FIG. 1 exemplifies the memory 144 disposed within the controller 130. In an embodiment, the memory 144 may be embodied by an external volatile memory having a memory interface transferring data between the memory 144 and the controller 130.

The processor 134 may control the overall operations of the memory system 110. The processor 134 may drive firmware to control the overall operations of the memory system 110. The firmware may be referred to as flash translation layer (FTL).

The processor 134 of the controller 130 may include a management unit (not illustrated) for performing a bad management operation of the memory device 150. The management unit may perform a bad block management operation of checking a bad block, in which a program fail occurs due to the characteristic of a NAND flash memory during a program operation, among the plurality of memory blocks 152 to 156 included in the memory device 150. The management unit may write the program-failed data of the bad block to a new memory block. In the memory device 150 having a 3D stack structure, the bad block management operation may reduce the use efficiency of the memory device 150 and the reliability of the memory system 110. Thus, the bad block management operation needs to be performed with more reliability.

Figure 2:
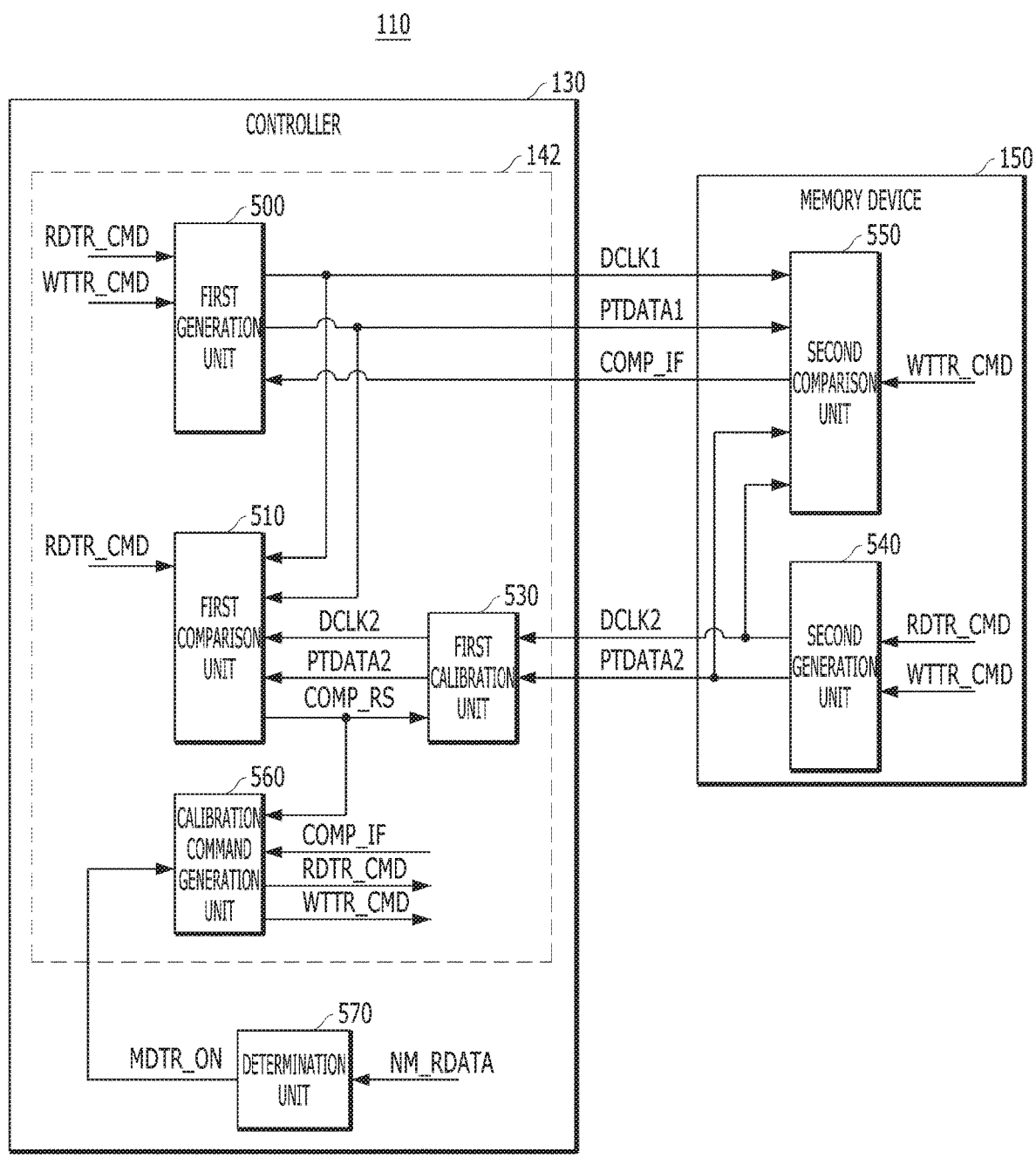
FIG. 2 is a block diagram illustrating a memory system in accordance with an embodiment of the disclosure.

FIG. 2 is a block diagram illustrating the memory system 110 in accordance with a first embodiment of the disclosure.

Figure 4A:
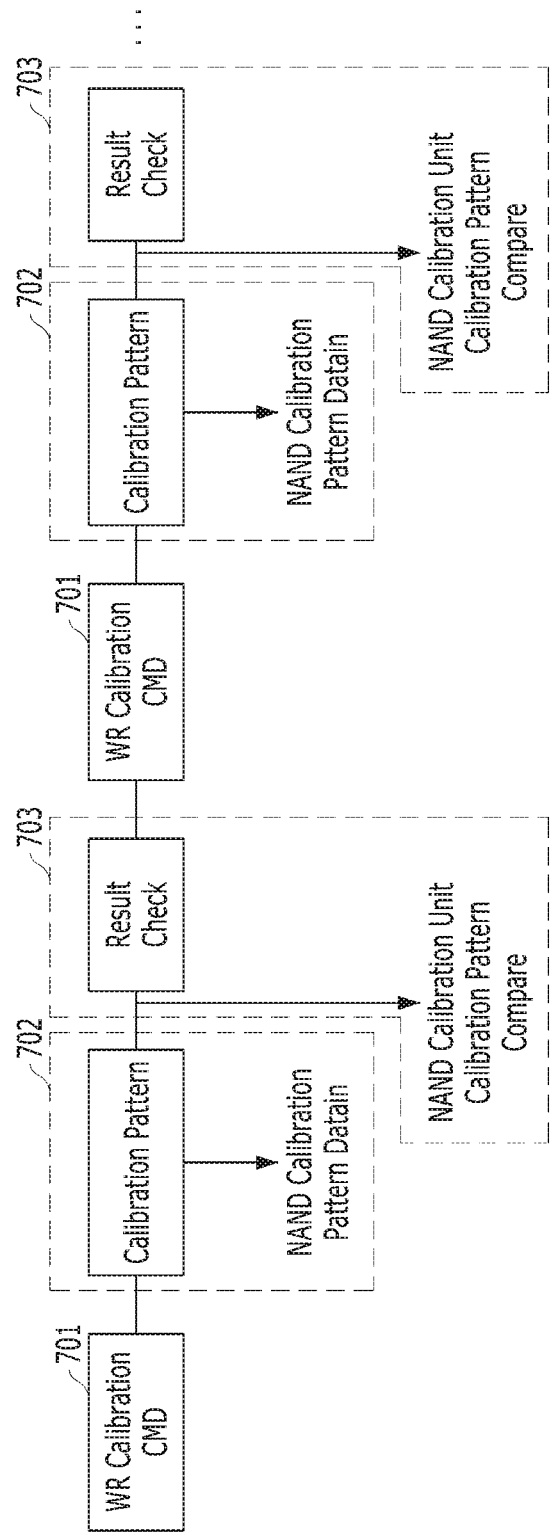
FIGS. 4A to 4D are diagrams illustrating data clock calibration operations of the memory systems shown in FIGS. 2 and 3.
Figure 4B:
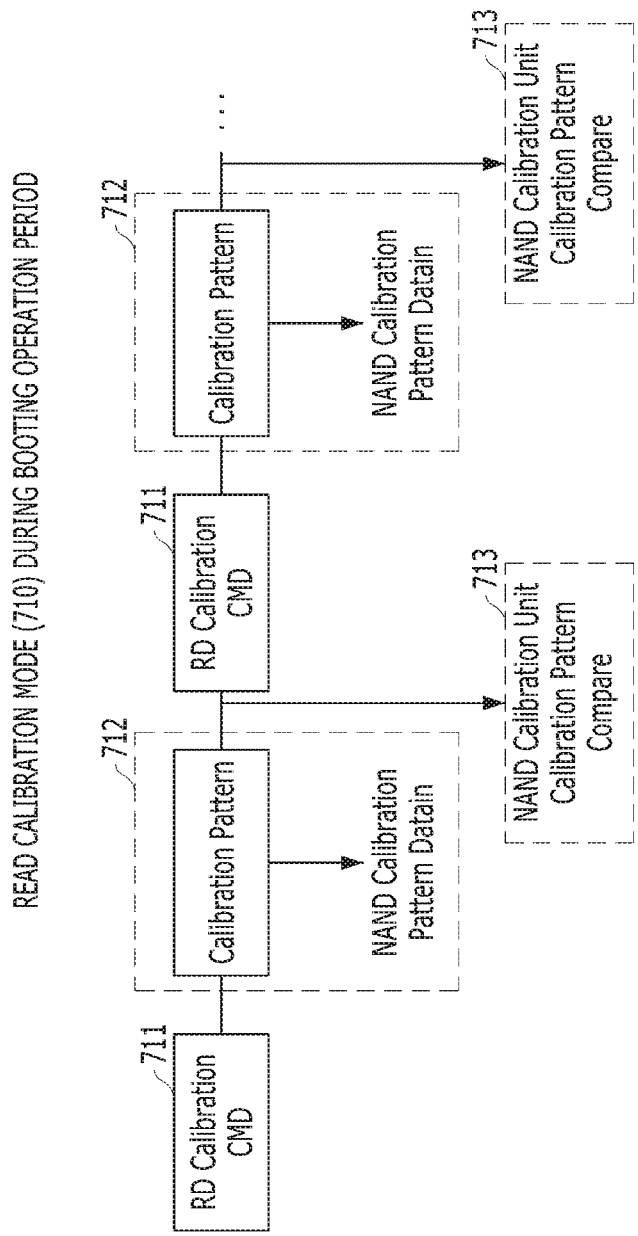
Figure 4C:
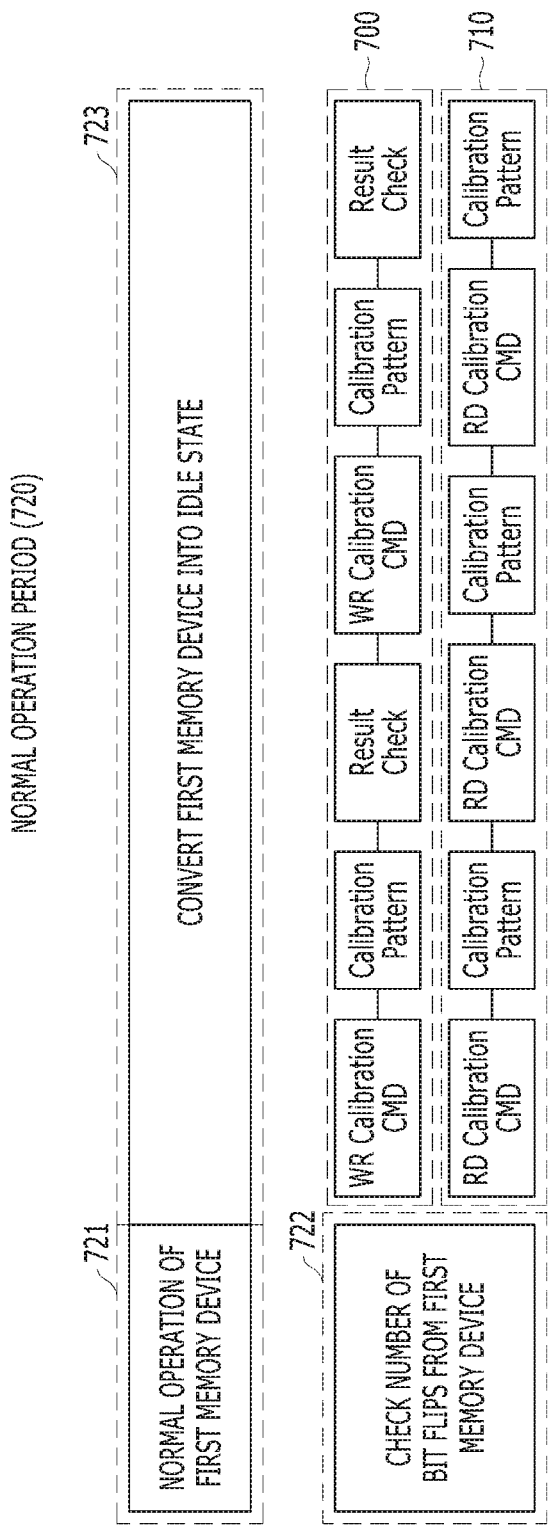

FIGS. 4A to 4C are diagrams illustrating a data clock calibration operation in accordance with the first embodiment.

Referring to FIG. 2, in a write calibration mode, the controller 130 generates a first data clock DCLK1 and first pattern data PTDATA1, a phase difference of which is to be calibrated depending on a comparison information COMP_IF provided from the memory device 150.

Also, in a read calibration mode, the controller 130 detects a value of second pattern data PTDATA2 provided from the memory device 150 according to a second data clock DCLK2 provided from the memory device 150, compares the detected value of second pattern data PTDATA2 with the value of the first pattern data PTDATA1 of the controller 130, and receives the second data clock DCLK2 provided from the memory device 150, which is calibrated depending on the comparison result between the detected values of the first pattern data PTDATA1 and the second pattern data PTDATA2.

In detail, according to the embodiment of FIG. 2, the MDI 142 includes a first generation unit 500, a first comparison unit 510, and a first calibration unit 530.

When operating in the read calibration mode, the first generation unit 500 generates the first pattern data PTDATA1 and the first data dock DCLK1 which have a predetermined phase difference. Also, when operating in the write calibration mode, the first generation unit 500 generates the first data clock DCLK1 and the first pattern data PTDATA1 which have a phase difference that is calibrated depending on a comparison information COMP_IF received from the memory device.

For example, the first generation unit 500 generates the first pattern data PTDATA1 and the first data clock DCLK1 which have the predetermined phase difference in the read calibration mode that the memory system 110 enters in response to a read calibration command RDTR_CMD. In an embodiment, the predetermined phase difference is such that the edge of the first data clock DCLK1 is positioned at about the middle of the data window of the first pattern data PTDATA1. Therefore, the value of the first pattern data PTDATA1 may be most precisely detected at the edge of the first data clock DCLK1.

Also, the first generation unit 500 generates the first pattern data PTDATA1 and the first data clock DCLK1 by changing the phase difference of the first pattern data PTDATA1 and the first data clock DCLK1 depending on the value of the comparison information COMP_IF in the write calibration mode that the memory system 110 enters in response to a write calibration command WTTR_CMD. When assuming that, at a first time point, the first pattern data PTDATA1 and the first data clock DCLK1 have a phase difference of K and the comparison information COMP_IF indicates a phase change, the first generation unit 500 generates, at a second time point later than the first time point, the first pattern data PTDATA1 and the first data clock DCLK1 which have a changed phase difference of K+A.

In the read calibration mode, the first comparison unit 510 compares the value of the first pattern data PTDATA1 detected according to the first data clock DCLK1 and a value of the second pattern data PTDATA2 detected according to the second data clock DCLK2 provided from the memory device 150, and generates a comparison signal COMP_RS depending on the comparison result between the detected values of the first pattern data PTDATA1 and the second pattern data PTDATA2.

As described above, the value of the first pattern data PTDATA1 are most precisely detected at the edge of the first data clock DCLK1 since the edge of the first data clock DCLK1 is positioned at the middle of the data window of the first pattern data PTDATA1 due to the predetermined phase difference between the first pattern data PTDATA1 and the first data dock DCLK1.

However, the second data dock DCLK2 and the second pattern data PTDATA2 provided from the memory device 150 may have a distorted phase difference due to various unpredictable environmental factors while the second data clock DCLK2 and the second pattern data PTDATA2 are transmitted from the memory device 150 to the controller 130, which may cause an erroneous detection of the value of the second pattern data PTDATA2 according to the second data clock DCLK2.

Thus, even when the original values of the first pattern data PTDATA1 and the second pattern data PTDATA2 are the same and the first and second data clocks DCLK1 and DCLK2 are the same, the detected values of the first pattern data PTDATA1 and the second pattern data PTDATA2 may be different due to a distorted phase difference between the second pattern data PTDATA2 and the second data clock DCLK2. Accordingly, the first comparison unit 510 may output the comparison signal COMP_RS which has the value of '0' indicating that the detected values of the first pattern data PTDATA1 and the second pattern data PTDATA2 are different from each other despite that the original values of the first pattern data PTDATA1 and the second pattern data PTDATA2 may be the same.

In the read calibration mode, the first calibration unit 530 calibrates the phase of the second data clock DCLK2 provided from the memory device 150 according to the comparison signal COMP_RS provided from the first comparison unit 510 in the read calibration mode. Through this, the distorted phase difference of the second data clock DCLK2 and the second pattern data PTDATA2 provided from the memory device 150 may be compensated.

The first calibration unit 530 changes the phase of the second data clock DCLK2 in response to the comparison signal COMP_RS having the value of '0' and keeps the phase of the second data clock DCLK2 in response to the comparison signal COMP_RS having the value of '1.'

In the write calibration mode, the memory device 150 detects the value of the first pattern data PTDATA1 according to the first data clock DCLK1, compares the detected value of the first pattern data PTDATA1 with the detected value of the second pattern data PTDATA2, generates the comparison information COMP_IF depending on the comparison result between the detected values of the first pattern data PTDATA1 and the second pattern data PTDATA2, and outputs the comparison information COMP_IF to the controller 130. Also, in the read calibration mode, the memory device 150 generates and outputs the second pattern data PTDATA2 and the second data clock DCLK2 which have the predetermined phase difference, to the controller 130.

According to the embodiment of FIG. 2, the memory device 150 includes a second generation unit 540 and a second comparison unit 550.

The second generation unit 540 generates the second pattern data PTDATA2 and the second data dock DCLK2 which have a predetermined phase difference in the read calibration mode and the write calibration mode. Namely, the second generation unit 540 generates the second pattern data PTDATA2 and the second data clock DCLK2 which are fixed to a state in which they have the predetermined phase difference, in the read calibration mode that is entered in response to the read calibration command RDTR_CMD and the write calibration mode that is entered in response to the write calibration command WTTR_CMD. Due to the predetermined phase difference, the edge of the second data clock DCLK2 is positioned at the middle of the data window of the second pattern data PTDATA2. Therefore, a value of the second pattern data PTDATA2 may be most precisely detected at the edge of the second data clock DCLK2. For example, when assuming that a value designated as the second pattern data PTDATA2 is '0 0 0 1 1 1 0 0 0 1 1 1,' by checking the value of the second pattern data PTDATA2 based on the edge of the second data clock DCLK2, the value of '0 0 0 1 1 1 0 0 0 1 1 1' may be checked reliably.

For reference, the value of the second pattern data PTDATA2 generated in the second generation unit 540 is not a fixed value. In other words, it represents merely one embodiment that the second pattern data PTDATA2 is designated to have the value of '0 0 0 1 1 1 0 0 1 1 1' as described above, and it is to be noted that the second pattern data PTDATA2 may be designated actually to have any other values.

In the write calibration mode, the second comparison unit 550 compares the value of the second pattern data PTDATA2 detected according to the second data clock DCLK2 and the value of the first pattern data PTDATA1 detected according to the first data clock DCLK1 provided from the controller 130, and generates the comparison information COMP_IF depending on the comparison result between the detected values of the first pattern data PTDATA1 and the second pattern data PTDATA2.

As described above, the value of the second pattern data PTDATA2 may be most precisely detected at the edge of the second data clock DCLK2 since the edge of the second data clock DCLK2 is positioned at the middle of the data window of the second pattern data PTDATA2 due to the predetermined phase difference between the second pattern data PTDATA2 and the second data clock DCLK2.

However, the first data clock DCLK1 and the first pattern data PTDATA1 provided from the controller 130 may have a distorted phase difference due to various unpredictable environmental factors while the first data clock DCLK1 and the first pattern data PTDATA1 are transmitted from the controller 130 to the memory device 150, which may cause an erroneous detection of the value of the first pattern data PTDATA1 according to the first data clock DCLK1.

Thus, even when the original values of the first pattern data PTDATA1 and the second pattern data PTDATA2 are the same and the first and second data docks DCLK1 and DCLK2 are the same, the detected values of the first pattern data PTDATA1 and the second pattern data PTDATA2 may be different due to the distorted phase difference between the second pattern data PTDATA2 and the second data clock DCLK2. Accordingly, the second comparison unit 550 may output the comparison information COMP_IF which has the value of '0' indicating that the detected values of the first pattern data PTDATA1 and the second pattern data PTDATA2 are different from each other despite that the original values of the first pattern data PTDATA1 and the second pattern data PTDATA2 are the same.

The first generation unit 500 calibrates the phase of the first data clock DCLK1 provided from the controller 130 depending on the comparison information COMP_IF provided from the second comparison unit 550 in the write calibration mode. Through this, the distorted phase difference of the first data clock DCLK1 and the first pattern data PTDATA1 provided from the controller 130 may be compensated.

The first generation unit 500 may change the phase of the first data clock DCLK1 in response to the comparison information COMP_IF having the value of '0' and keep the phase of the first data clock DCLK1 in response to the comparison information COMP_IF having the value of '1.'

The original value of the first pattern data PTDATA1 detected according to the first data clock DCLK1 in the first generation unit 500 may be the same as the original value of the second pattern data PTDATA2 detected according to the second data clock DCLK2 in the second generation unit 540.

For example, in the case of changing the first pattern data PTDATA1 within a first predetermined time before generating first the first pattern data PTDATA1 after entering the read calibration mode or the write calibration, the controller 130 further provides a separate command (not shown) and a change information (not shown) to the second generation unit 540 within the first predetermined time such that the second generation unit 540 changes the second pattern data PTDATA2 within a second predetermined time before generating first the second pattern data PTDATA2 after entering the read calibration mode or the write calibration mode.

The separate command may be transferred to the second generation unit 540 through a command path. The change information may be transferred to the second generation unit 540 through an address path.

The controller 130 further includes a calibration command generation unit 560 and a determination unit 570.

The calibration command generation unit 560 generates the read calibration command RDTR_CMD when the memory system 110 enters a read calibration period at a first predetermined time point during a booting operation period. Then, the calibration command generation unit 560 determines whether to generate additionally the read calibration command RDTR_CMD in response to the comparison signal COMP_RS provided from the first comparison unit 510.

Namely, the calibration command generation unit 560 enters the read calibration period at the first predetermined time point during the booting operation period, and accordingly, generates the read calibration command RDTR_CMD. The first comparison unit 510 may generate the comparison signal COMP_RS in response to the read calibration command RDTR_CMD, The calibration command generation unit 560 may determine whether to additionally generate the read calibration command RDTR_CMD according to the comparison signal COMP_RS in the read calibration period. When the calibration command generation unit 560 determines not to additionally generate the read calibration command RDTR_CMD according to the comparison signal COMP_RS, the memory system 110 may end the read calibration period and the booting operation period continues.

Also, the calibration command generation unit 560 generates the write calibration command WTTR_CMD when the memory system 110 enters a write calibration period at a second predetermined time point during the booting operation period. Then, the calibration command generation unit 560 determines whether to generate additionally the write calibration command WTTR_CMD in response to the comparison information COMP_IF provided from the second comparison unit 550 in the memory device 150.

That is to say, the calibration command generation unit 560 enters the write calibration period at the second predetermined time point during the booting operation period, and accordingly, generates the write calibration command WTTR_CMD. The first comparison unit 510 may generate the comparison information COMP_IF in response to the write calibration command WTTR_CMD. The calibration command generation unit 560 may determine whether to additionally generate the write calibration command WTTR_CMD according to the comparison information COMP_IF. When the calibration command generation unit 560 determines not to additionally generate the write calibration command WTTR_CMD according to the comparison information COMP_IF, the memory system 110 may end the write calibration period and the booting operation period continues.

For example, the booting operation of the memory system 110 may include a first boot period, a second boot period and a kernel boot period. The first boot period may include the first predetermined time point for performing the read calibration operation, and the second boot period may include the second predetermined time point for performing the write calibration operation.

The determination unit 570 determines whether the number of bit flips in normal data NM_RDATA read from the memory device 150 during a normal operation period exceeds a predetermined reference.

The normal operation may include a normal read operation of reading the normal data NM_RDATA from the memory device 150 and a normal write operation of storing normal data into the memory device 150.

During the normal operation, the determination unit 570 generates a determination signal MDTR_ON when a number of bits having opposite values in the data NM_RDATA exceeds a predetermined number or when the memory device 150 is in an idle state for a predetermined time.

The memory system 110 may enter an intermediate calibration period in response to the determination signal MDTR_ON during the normal operation. The calibration command generation unit 560 performs the above-described operation in response to the determination signal MDTR_ON during the normal operation. When the calibration command generation unit 560 determines not to additionally generate the calibration commands RDTR_CMD and WTTR_CMD according to the comparison information COMP_RS and COMP_IF, respectively, the memory system 110 may end the calibration periods and the normal operation period continues.

Referring to FIG. 4A, the write calibration command WTTR_CMD is generated when the memory system 110 enters a write calibration mode 700 at step 701.

In response to the write calibration command WTTR_CMD, the first data clock DCLK1 and the first pattern data PTDATA1 are generated and transferred to the memory device 150 by the first generation unit 500 at step 702.

In the case where the memory system 110 enters the write calibration mode 700 during the booting operation period, the first data clock DCLK1 and the first pattern data PTDATA1 are generated by the first generation unit 500 to have the predetermined phase difference.

Further, in the case where the memory system 110 enters the write calibration mode 700 during the normal operation period, the first data clock DCLK1 and the first pattern data PTDATA1 are generated by the first generation unit 500 to have the phase difference used in the normal operation period.

The first generation unit 500 may provide the first data clock DCLK1 and the first pattern data PTDATA1 to the second comparison unit 550.

In response to the write calibration command WTTR_CMD, the second data clock DCLK2 and the second pattern data PTDATA2 which have the predetermined phase difference are generated transferred to the second comparison unit 550 by the second generation unit 540.

Accordingly, in the second comparison unit 550, the value of the second pattern data PTDATA2 detected according to the second data clock DCLK2 and the value of the first pattern data PTDATA1 detected according to the first data clock DCLK1 are compared at step 703.

As a comparison result of the second comparison unit 550, if the two values are the same with each other, the comparison information COMP_IF has the value of '1' and the first generation unit 500 does not change the phase of the first data clock DCLK1. Further, if the comparison information COMP_IF has the value of '1', the calibration command generation unit 560 does not generate additionally the write calibration command WTTR_CMD, whereby the memory system 110 ends the write calibration mode 700 to complete the write calibration operation.

As a comparison result of the second comparison unit 550, if the two values are different from each other, the comparison information COMP_IF has the value of '0' and the first generation unit 500 calibrates the phase of the first data clock DCLK1 according to the comparison information COMP_IF in response to the write calibration command WTTR_CMD, which the calibration command generation unit 560 additionally generates according to the comparison information COMP_IF, whereby the operations 701, 702 and 703 of the write calibration mode 700 continue.

Referring to FIG. 4B, the read calibration command RDTR_CMD is generated when the memory system 110 enters a read calibration mode 710 at step 711.

In response to the read calibration command RDTR_CMD, the second data clock DCLK2 and the second pattern data PTDATA2 are generated and transmitted to the controller 130 by the second generation unit 540 at step 712.

In the case where the memory system 220 enters the read calibration mode 720 during the booting operation period, the second data clock DCLK2 and the second pattern data PTDATA2 are generated by the second generation unit 540 to have the predetermined phase difference.

Further, in the case where the memory system 220 enters the read calibration mode 720 during the normal operation period, the second data clock DCLK2 and the second pattern data PTDATA2 are generated by the second generation unit 540 to have the phase difference used in the normal operation period.

The second generation unit 540 may provide the second data clock DCLK2 and the second pattern data PTDATA2 to the first comparison unit 510 through the first calibration unit 530.

In response to the read calibration command RDTR_CMD, the first data clock DCLK1 and the first pattern data PTDATA1 which have the predetermined phase difference are generated and transferred to the first comparison unit 510 by the first generation unit 500.

Accordingly, in the first comparison unit 510, the value of the second pattern data PTDATA2 detected according to the second data clock DCLK2 and the value of the first pattern data PTDATA1 detected according to the first data clock DCLK1 are compared at step 713.

As a comparison result of the first comparison unit 510, if the two values are the same with each other, the comparison signal COMP_RS has the value of '1' and the first calibration unit 530 does not change the phase of the second data clock DCLK2. Further, if the comparison signal COMP_RS has the value of the calibration command generation unit 560 does not generate additionally the read calibration command RDTR_CMD, whereby the memory system 110 ends the read calibration mode to complete the read calibration operation.

As a comparison result of the first comparison unit 510, if the two values are different from each other, the comparison signal COMP_RS has the value of '0' and the first calibration unit 530 calibrates the phase of the second data clock DCLK2 according to the comparison information COMP_RS in response to the read calibration command RDTR_CMD, which the calibration command generation unit 560 additionally generates according to the comparison information COMP_RS, whereby the operations 711, 712 and 713 of the read calibration mode 710 continue.

Referring to FIG. 4C, while the memory device 150 is performing a normal read operation in a period 721 of the normal operation period 720, the determination unit 570 checks the number of bit flips of the normal data NM_RDATA read from the memory device 150 at step 722.

When the number of bits having opposite values of the read data NM_RDATA exceeds the predetermined number, the memory device 150 may transition in the idle state at step 723.

When the memory device 150 is in the idle state according to the operation of the determination unit 570, the memory system 110 may enter the intermediate calibration mode. In the intermediate calibration mode, the memory system 110 may enter the read calibration mode 710 and the write calibration mode 700 and the controller 130 and the memory device 150 may perform the read calibration operation and the write calibration operation, as described above.

Second Embodiment

Figure 3:
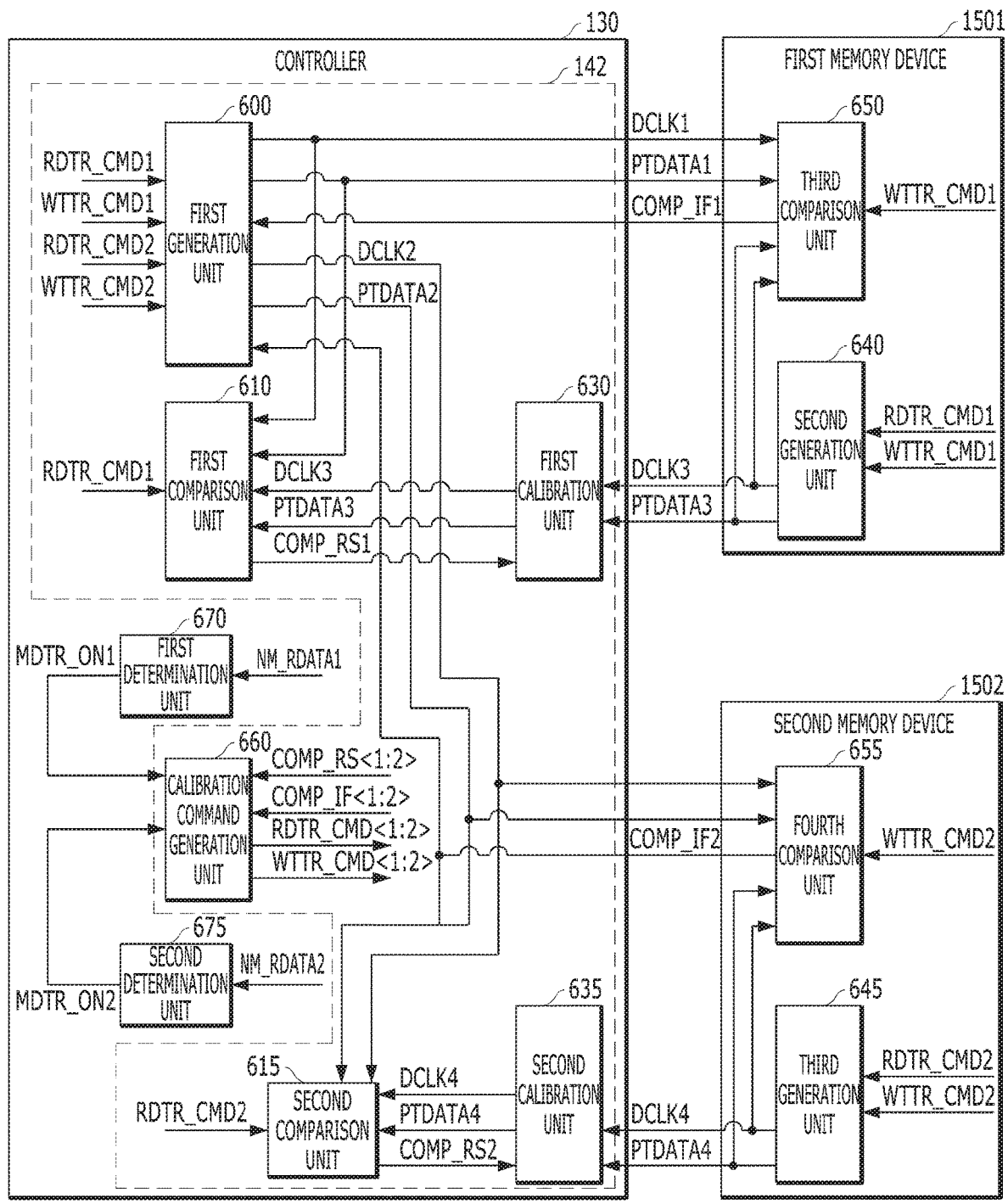
FIG. 3 is a block diagram illustrating a memory system in accordance with an embodiment of the disclosure.

FIG. 3 is a block diagram illustrating the memory system 110 in accordance with a second embodiment of the disclosure.

Figure 4D:
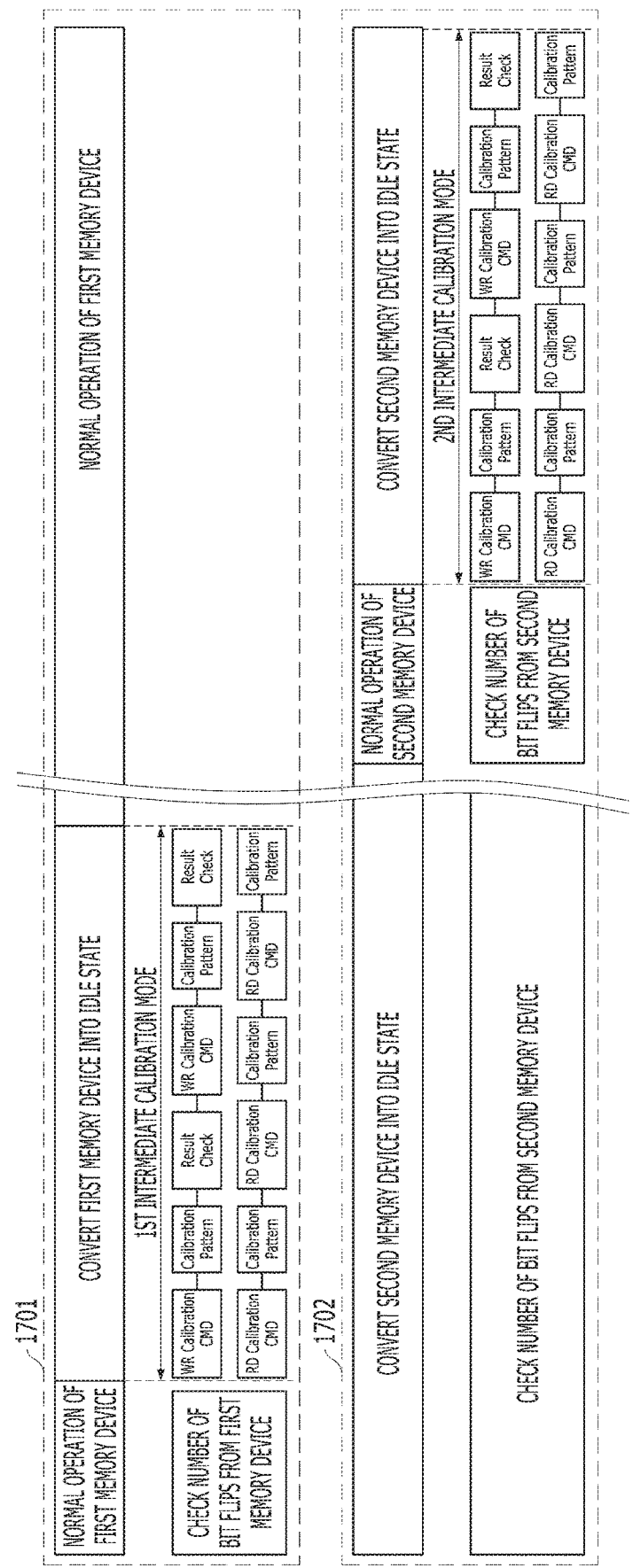

FIG. 4D is a diagram illustrating a data clock calibration operation in accordance with the second embodiment.

The memory system 110 shown in FIG. 3 may be the same as the memory system 110 described with reference to FIGS. 2 to 4C except that the memory system 110 may include a plurality of memory devices 1501 and 1502.

Operations between the controller 130 and each of the memory devices 1501 and 1502 may be the same as the operations between the controller 130 and the memory device 150 described with reference to FIGS. 2 to 4C.

As to the controller 130 and the first memory device 1501 of FIG. 3, a first pattern data PTDATA1, a first data clock DCLK1, a third pattern data PTDATA3, a third data clock DCLK3, a first read calibration command RDTR_CMD1, a first write calibration command WTTR_CMD1, a first comparison information COMP_IF1, a first comparison information COMP_RS1, a first determination signal MDTR_ON1, and a first normal data NM_RDATA1 may correspond to the first pattern data PTDATA1, the first data clock DCLK1, the second pattern data PTDATA2, the second data clock DCLK2, the read calibration command RDTR_CMD, the write calibration command WTTR_CMD, the comparison information COMP_IF, the comparison information COMP_RS, the determination signal MDTR_ON, and the normal data NM_RDATA described with reference to FIGS. 2 to 4C, respectively.

As to the controller 130 and the first memory device 1501 of FIG. 3, a first generation unit 600, a first comparison unit 610, a first calibration unit 630, a calibration command generation unit 660, a first determination unit 670, a third comparison unit 650 and a second generation unit 640 may correspond to the first generation unit 500, the first comparison unit 510, the first calibration unit 530, the calibration command generation unit 560, the determination unit 570, the second comparison unit 550 and the second generation unit 540 described with reference to FIGS. 2 to 4C, respectively.

As to the controller 130 and the second memory device 1502 of FIG. 3, a second pattern data PTDATA2, a second data clock DCLK2, a fourth pattern data PTDATA4, a fourth data clock DCLK4, a second read calibration command RDTR_CMD2, a second write calibration command WTTR_CMD2, a second comparison information COMP_IF2, a second comparison information COMP_RS2, a second determination signal MDTR_ON1, and a second normal data NM_RDATA2 may correspond to the first pattern data PTDATA1, the first data clock DCLK1, the second pattern data PTDATA2, the second data clock DCLK2, the read calibration command RDTR_CMD, the write calibration command WTTR_CMD, the comparison information COMP_IF, the comparison information COMP_RS, the determination signal MDTR_ON, and the normal data NM_RDATA described with reference to FIGS. 2 to 4C, respectively.

As to the controller 130 and the second memory device 1502 of FIG. 3, the first generation unit 600, the first comparison unit 610, the first calibration unit 630, the calibration command generation unit 660, a second determination unit 675, the third comparison unit 650 and the second generation unit 640 may correspond to the first generation unit 500, the first comparison unit 510, the first calibration unit 530, the calibration command generation unit 560, the determination unit 570, the second comparison unit 550 and the second generation unit 540 described with reference to FIGS. 2 to 4C, respectively.

FIG. 4D shows a first intermediate calibration mode and a second intermediate calibration mode each corresponding to the intermediate calibration mode described with reference to FIGS. 2 to 4C. The first intermediate calibration mode may be between the controller 130 and the first memory device 1501, and the second intermediate calibration mode may be between the controller 130 and the second memory device 1502. The first and second intermediate calibration mode may be independent from each other.

First, the normal operation period of the first memory device 1501 and the normal operation period of the second memory device 1502 respectively described above with reference to FIG. 4C may overlap with each other. Also, the operation of checking the number of bit flips of the data NM_RDATA1 read from the first memory device 1501 and the operation of checking the number of bit flips of the data NM_RDATA2 read from the second memory device 1502 may be performed independently of each other.

Further, a period 1701 in which the first memory device 1501 enters the first intermediate calibration mode and performs the operations of a first read calibration mode 710, which correspond to the read calibration mode 710 described with reference to FIGS. 2 to 4C, and a first write calibration mode 700, which correspond to the write calibration mode 700 described with reference to FIGS. 2 to 4C, and a period 1702 in which the second memory device 1502 enters the second intermediate calibration mode and performs the operations of a second read calibration mode 710, which correspond to the read calibration mode 710 described with reference to FIGS. 2 to 4C, and a second write calibration mode 700, which correspond to the write calibration mode 700 described with reference to FIGS. 2 to 4C, may not overlap with each other. The first read and write calibration modes 710 and 700 may be between the controller 130 and the first memory device 1501, and the second read and write calibration modes 710 and 700 may be between the controller 130 and the second memory device 1502.

That is to say, in the period 1701 in which the first memory device 1501 enters the first intermediate calibration mode and performs the operations of the first read calibration mode 710 and the first write calibration mode 700, the second memory device 1502 may be continuously in the state in which the second memory device 1502 has entered the normal operation period. Similarly, in the period 1702 in which the second memory device 1502 enters the second intermediate calibration mode and performs the operations of the second read calibration mode 710 and the second write calibration mode 700, the first memory device 1501 may be continuously in the state in which the first memory device 1501 has entered the normal operation period. Of course, as the case may be, it may be envisaged that the period 1701 in which the first memory device 1501 enters the first intermediate calibration mode and performs the operations of the first read calibration mode 710 and the first write calibration mode 700 and the period 1702 in which the second memory device 1502 enters the second intermediate calibration mode and performs the operations of the second read calibration mode 710 and the second write calibration mode 700 overlap with each other.

FIGS. 5 to 13 are diagrams schematically illustrating application examples of the data processing system of FIG. 1.

Figure 5:
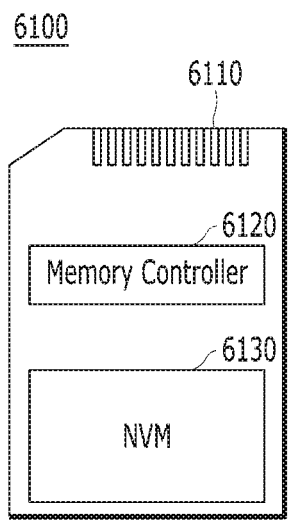
FIGS. 5 to 13 are diagrams schematically illustrating application examples of the data processing system shown in FIG. 1 in accordance with various embodiments of the present invention.

FIG. 5 is a diagram schematically illustrating another example of the data processing system including the memory system in accordance with the present embodiment. FIG. 5 schematically illustrates a memory card system to which the memory system in accordance with the present embodiment is applied.

Referring to FIG. 5, the memory card system 6100 may include a memory controller 6120, a memory device 6130 and a connector 6110.

More specifically, the memory controller 6120 may be connected to the memory device 6130 embodied by a nonvolatile memory, and configured to access the memory device 6130. For example, the memory controller 6120 may be configured to control read, write, erase and background operations of the memory device 6130. The memory controller 6120 may be configured to provide an interface between the memory device 6130 and a host, and drive firmware for controlling the memory device 6130. That is, the memory controller 6120 may correspond to the controller 130 of the memory system 110 described with reference to FIGS. 1 and 2, and the memory device 6130 may correspond to the memory device 150 of the memory system 110 described with reference to FIGS. 1 and 2.

Thus, the memory controller 6120 may include a RAM, a processing unit, a host interface, a memory interface and an error correction unit. The memory controller 130 may further include the elements shown in FIG. 5.

The memory controller 6120 may communicate with an external device, for example, the host 102 of FIG. 1 through the connector 6110. For example, as described with reference to FIG. 1, the memory controller 6120 may be configured to communicate with an external device through one or more of various communication protocols such as universal serial bus (USB), multimedia card (MMC), embedded MMC (eMMC), peripheral component interconnection (PCI), PCI express (PCIe), Advanced Technology Attachment (ATA), Serial-ATA, Parallel-ATA, small computer system interface (SCSI), enhanced small disk interface (EDSI), Integrated Drive Electronics (IDE), Firewire, universal flash storage (UFS), WIFI and Bluetooth. Thus, the memory system and the data processing system in accordance with the present embodiment may be applied to wired/wireless electronic devices or particularly mobile electronic devices.

The memory device 6130 may be implemented by a nonvolatile memory. For example, the memory device 6130 may be implemented by various nonvolatile memory devices such as an erasable and programmable ROM (EPROM), an electrically erasable and programmable ROM (EEPROM), a NAND flash memory, a NOR flash memory, a phase-change RAM (PRAM), a resistive RAM (ReRAM), a ferroelectric RAM (FRAM) and a spin torque transfer magnetic RAM (STT-RAM). The memory device 6130 may include a plurality of dies as in the memory device 150 of FIG. 5.

The memory controller 6120 and the memory device 6130 may be integrated into a single semiconductor device. For example, the memory controller 6120 and the memory device 6130 may construct a solid state driver (SSD) by being integrated into a single semiconductor device. Also, the memory controller 6120 and the memory device 6130 may construct a memory card such as a PC card (PCMCIA: Personal Computer Memory Card International Association), a compact flash (CF) card, a smart media card (e.g., SM and SMC), a memory stick, a multimedia card (e.g., MMC, RS-MMC, MMCmicro and eMMC), an SD card (e.g., SD, miniSD, microSD and SDHC) and a universal flash storage (UFS).

Figure 6:
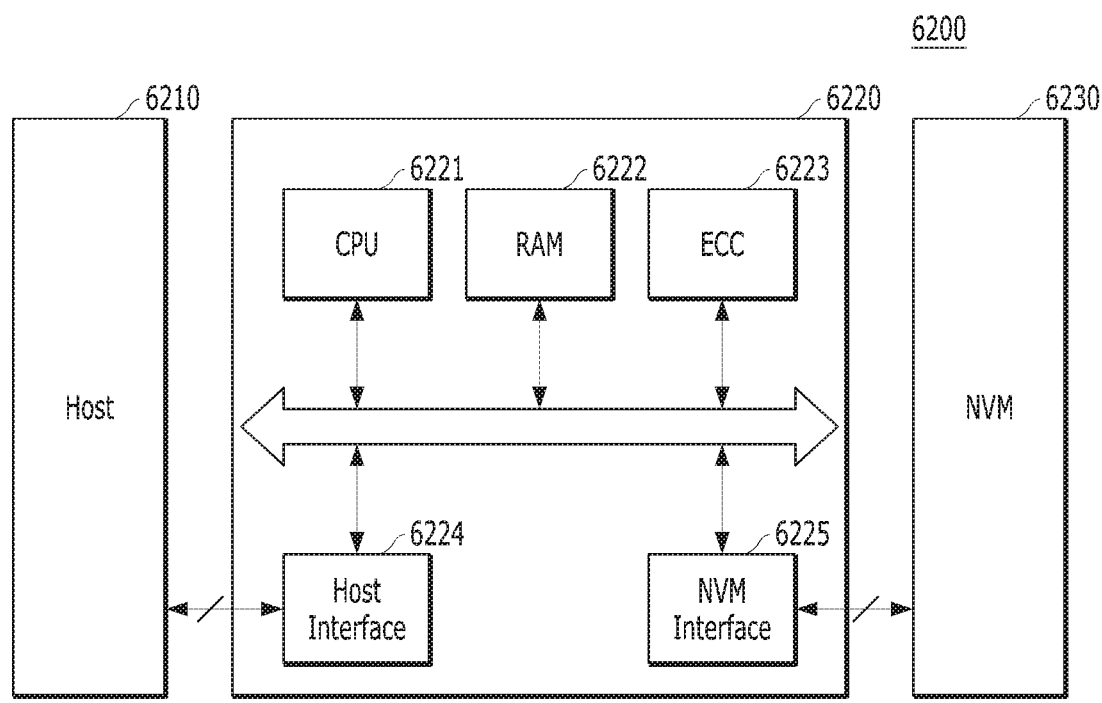

FIG. 6 is a diagram schematically illustrating another example of the data processing system including the memory system in accordance with the present embodiment.

Referring to FIG. 6, the data processing system 6200 may include a memory device 6230 having one or more nonvolatile memories and a memory controller 6220 for controlling the memory device 6230. The data processing system 6200 illustrated in FIG. 6 may serve as a storage medium such as a memory card (CF, SD, micro-SD or the like) or USB device, as described with reference to FIG. 1. The memory device 6230 may correspond to the memory device 150 in the memory system 110 illustrated in FIGS. 1 and 2, and the memory controller 6220 may correspond to the controller 130 in the memory system 110 illustrated in FIGS. 1 and 2.

The memory controller 6220 may control a read, write or erase operation on the memory device 6230 in response to a request of the host 6210, and the memory controller 6220 may include one or more CPUs 6221, a buffer memory such as RAM 6222, an ECC circuit 6223, a host interface 6224 and a memory interface such as an NVM interface 6225.

The CPU 6221 may control overall operations on the memory device 6230, for example, read, write, file system management and bad page management operations. The RAM 6222 may be operated according to control of the CPU 6221, and used as a work memory, buffer memory or cache memory. When the RAM 6222 is used as a work memory, data processed by the CPU 6221 may be temporarily stored in the RAM 6222. When the RAM 6222 is used as a buffer memory, the RAM 6222 may be used for buffering data transmitted to the memory device 6230 from the host 6210 or transmitted to the host 6210 from the memory device 6230. When the RAM 6222 is used as a cache memory, the RAM 6222 may assist the low-speed memory device 6230 to operate at high speed.

The ECC circuit 6223 may correspond to the ECC unit 138 of the controller 130 illustrated in FIG. 1. As described with reference to FIG. 1, the ECC circuit 6223 may generate an ECC (Error Correction Code) for correcting a fail bit or error bit of data provided from the memory device 6230. The ECC circuit 6223 may perform error correction encoding on data provided to the memory device 6230, thereby forming data with a parity bit. The parity bit may be stored in the memory device 6230. The ECC circuit 6223 may perform error correction decoding on data provided from the memory device 6230. At this time, the ECC circuit 6223 may correct an error using the parity bit. For example, as described with reference to FIG. 1, the ECC circuit 6223 may correct an error using the LDPC code, BCH code, turbo code, Reed-Solomon code, convolution code, RSC or coded modulation such as TCM or BCM.

The memory controller 6220 may transmit/receive data to/from the host 6210 through the host interface 6224, and transmit/receive data to/from the memory device 6230 through the NVM interface 6225. The host interface 6224 may be connected to the host 6210 through a PATA bus, SATA bus, SCSI, USB, PCIe or NAND interface. The memory controller 6220 may have a wireless communication function with a mobile communication protocol such as WiFi or Long Term Evolution (LTE). The memory controller 6220 may be connected to an external device, for example, the host 6210 or another external device, and then transmit/receive data to/from the external device. In particular, as the memory controller 6220 is configured to communicate with the external device through one or more of various communication protocols, the memory system and the data processing system in accordance with the present embodiment may be applied to wired/wireless electronic devices or particularly a mobile electronic device.

Figure 7:
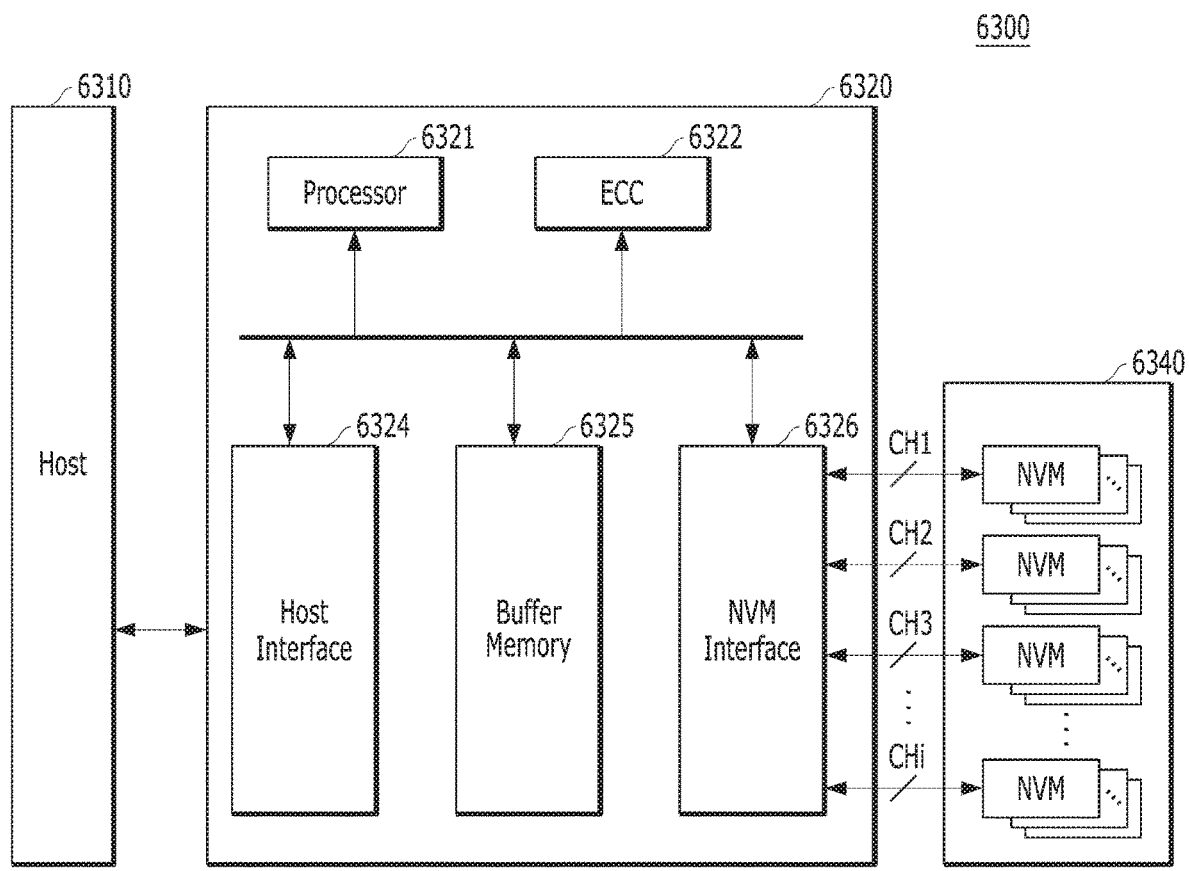

FIG. 7 is a diagram schematically illustrating another example of the data processing system including the memory system in accordance with the present embodiment. FIG. 7 schematically illustrates an SSD to which the memory system in accordance with the present embodiment is applied.

Referring to FIG. 7, the SSD 6300 may include a controller 6320 and a memory device 6340 including a plurality of nonvolatile memories. The controller 6320 may correspond to the controller 130 in the memory system 110 of FIGS. 1 and 2, and the memory device 6340 may correspond to the memory device 150 in the memory system of FIGS. 1 and 2.

More specifically, the controller 6320 may be connected to the memory device 6340 through a plurality of channels CH1 to CHi. The controller 6320 may include one or more processors 6321, a buffer memory 6325, an ECC circuit 6322, a host interface 6324 and a memory interface, for example, a nonvolatile memory interface 6326.

The buffer memory 6325 may temporarily store data provided from the host 6310 or data provided from a plurality of flash memories NVM included in the memory device 6340, or temporarily store meta data of the plurality of flash memories NVM, for example, map data including a mapping table. The buffer memory 6325 may be embodied by volatile memories such as DRAM, SDRAM, DDR SDRAM, LPDDR SDRAM and GRAM or nonvolatile memories such as FRAM, ReRAM, STT-MRAM and PRAM. For convenience of description, FIG. 6 illustrates that the buffer memory 6325 exists in the controller 6320. However, the buffer memory 6325 may exist outside the controller 6320.

The ECC circuit 6322 may calculate an ECC value of data to be programmed to the memory device 6340 during a program operation, perform an error correction operation on data read from the memory device 6340 based on the ECC value during a read operation, and perform an error correction operation on data recovered from the memory device 6340 during a failed data recovery operation.

The host interface 6324 may provide an interface function with an external device, for example, the host 6310, and the nonvolatile memory interface 6326 may provide an interface function with the memory device 6340 connected through the plurality of channels.

Furthermore, a plurality of SSDs 6300 to which the memory system 110 of FIGS. 1 and 2 is applied may be provided to embody a data processing system, for example, RAID (Redundant Array of Independent Disks) system. At this time, the RAID system may include the plurality of SSDs 6300 and a RAID controller for controlling the plurality of SSDs 6300. When the RAID controller performs a program operation in response to a write command provided from the host 6310, the RAID controller may select one or more memory systems or SSDs 6300 according to a plurality of RAID levels, that is, RAID level information of the write command provided from the host 6310 in the SSDs 6300, and output data corresponding to the write command to the selected SSDs 6300. Furthermore, when the RAID controller performs a read command in response to a read command provided from the host 6310, the RAID controller may select one or more memory systems or SSDs 6300 according to a plurality of RAID levels, that is, RAID level information of the read command provided from the host 6310 in the SSDs 6300, and provide data read from the selected SSDs 6300 to the host 6310.

Figure 8:
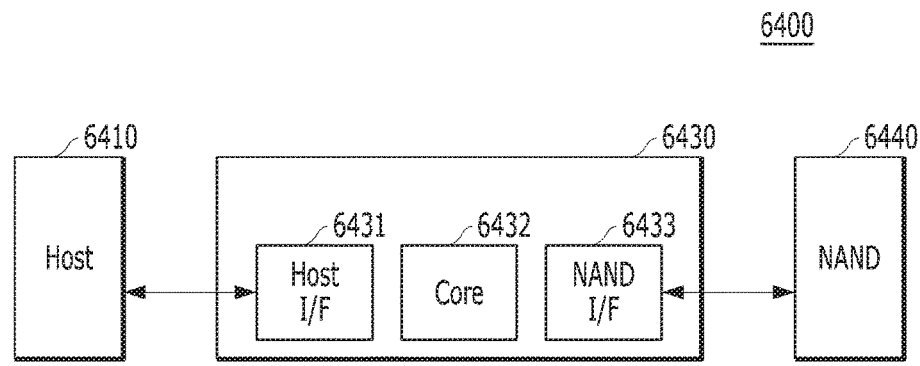

FIG. 8 is a diagram schematically illustrating another example of the data processing system including the memory system in accordance with the present embodiment. FIG. 8 schematically illustrates an embedded Multi-Media Card (eMMC) to which the memory system in accordance with the present embodiment is applied.

Referring to FIG. 8, the eMMC 6400 may include a controller 6430 and a memory device 6440 embodied by one or more NAND flash memories. The controller 6430 may correspond to the controller 130 in the memory system 110 of FIGS. 1 and 2, and the memory device 6440 may correspond to the memory device 150 in the memory system 110 of FIGS. 1 and 2.

More specifically, the controller 6430 may be connected to the memory device 6440 through a plurality of channels. The controller 6430 may include one or more cores 6432, a host interface 6431 and a memory interface, for example, a NAND interface 6433.

The core 6432 may control overall operations of the eMMC 6400, the host interface 6431 may provide an interface function between the controller 6430 and the host 6410, and the NAND interface 6433 may provide an interface function between the memory device 6440 and the controller 6430. For example, the host interface 6431 may serve as a parallel interface, for example, MMC interface as described with reference to FIG. 1. Furthermore, the host interface 6431 may serve as a serial interface, for example, UHS ((Ultra High Speed)-I/UHS-II) interface.

FIGS. 9 to 12 are diagrams schematically illustrating other examples of the data processing system including the memory system in accordance with the present embodiment. FIGS. 9 to 12 schematically illustrate UFS (Universal Flash Storage) systems to which the memory system in accordance with the present embodiment is applied.

Referring to FIGS. 9 to 12, the UFS systems 6500, 6600, 6700 and 6800 may include hosts 6510, 6610, 6710 and 6810, UFS devices 6520, 6620, 6720 and 6820 and UFS cards 6530, 6630, 6730 and 6830, respectively. The hosts 6510, 6610, 6710 and 6810 may serve as application processors of wired/wireless electronic devices or particularly mobile electronic devices, the UFS devices 6520, 6620, 6720 and 6820 may serve as embedded UFS devices, and the UFS cards 6530, 6630, 6730 and 6830 may serve as external embedded UFS devices or removable UFS cards.

The hosts 6510, 6610, 6710 and 6810, the UFS devices 6520, 6620, 6720 and 6820 and the UFS cards 6530, 6630, 6730 and 6830 in the respective UFS systems 6500, 6600, 6700 and 6800 may communicate with external devices, for example, wired/wireless electronic devices or particularly mobile electronic devices through UFS protocols, and the UFS devices 6520, 6620, 6720 and 6820 and the UFS cards 6530, 6630, 6730 and 6830 may be embodied by the memory system 110 illustrated in FIGS. 1 and 2. For example, in the UFS systems 6500, 6600, 6700 and 6800, the UFS devices 6520, 6620, 6720 and 6820 may be embodied in the form of the data processing system 6200, the SSD 6300 or the eMMC 6400 described with reference to FIGS. 6 to 8, and the UFS cards 6530, 6630, 6730 and 6830 may be embodied in the form of the memory card system 6100 described with reference to FIG. 5.

Furthermore, in the UFS systems 6500, 6600, 6700 and 6800, the hosts 6510, 6610, 6710 and 6810, the UFS devices 6520, 6620, 6720 and 6820 and the UFS cards 6530, 6630, 6730 and 6830 may communicate with each other through an UFS interface, for example, MIPI M-PHY and MIPI UniPro (Unified Protocol) in MIPI (Mobile Industry Processor Interface). Furthermore, the UFS devices 6520, 6620, 6720 and 6820 and the UFS cards 6530, 6630, 6730 and 6830 may communicate with each other through various protocols other than the UFS protocol, for example, UFDs, MMC, SD, mini-SD, and micro-SD.

Figure 9:
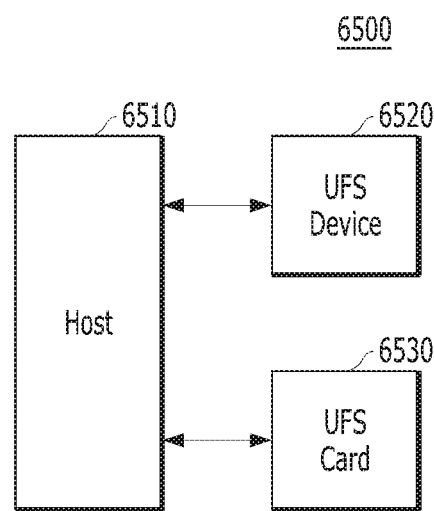

In the UFS system 6500 illustrated in FIG. 9, each of the host 6510, the UFS device 6520 and the UFS card 6530 may include UniPro. The host 6510 may perform a switching operation in order to communicate with the UFS device 6520 and the UFS card 6530. In particular, the host 6510 may communicate with the UFS device 6520 or the UFS card 6530 through link layer switching, for example, L3 switching at the UniPro. At this time, the UFS device 6520 and the UFS card 6530 may communicate with each other through link layer switching at the UniPro of the host 6510. In the present embodiment, the configuration in which one UFS device 6520 and one UFS card 6530 are connected to the host 6510 has been exemplified for convenience of description. However, a plurality of UFS devices and UFS cards may be connected in parallel or in the form of a star to the host 6410, and a plurality of UFS cards may be connected in parallel or in the form of a star to the UFS device 6520 or connected in series or in the form of a chain to the UFS device 6520.

Figure 10:
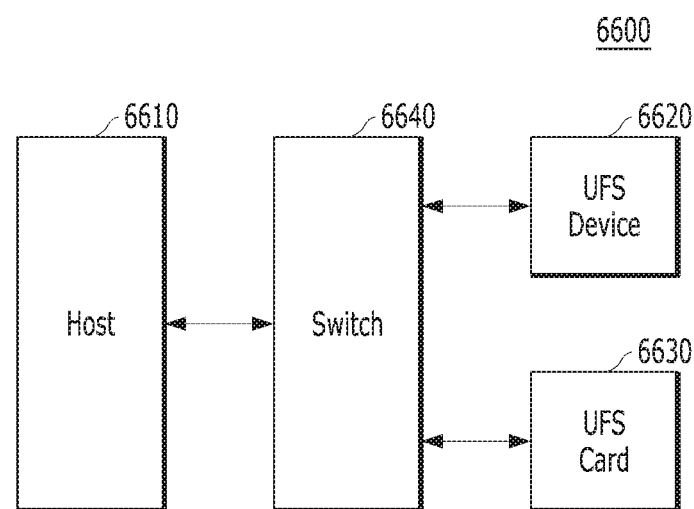

In the UFS system 6600 illustrated in FIG. 10, each of the host 6610, the UFS device 6620 and the UFS card 6630 may include UniPro, and the host 6610 may communicate with the UFS device 6620 or the UFS card 6630 through a switching module 6640 performing a switching operation, for example, through the switching module 6640 which performs link layer switching at the UniPro, for example, L3 switching. The UFS device 6620 and the UFS card 6630 may communicate with each other through link layer switching of the switching module 6640 at UniPro. In the present embodiment, the configuration in which one UFS device 6620 and one UFS card 6630 are connected to the switching module 6640 has been exemplified for convenience of description. However, a plurality of UFS devices and UFS cards may be connected in parallel or in the form of a star to the switching module 6640, and a plurality of UFS cards may be connected in series or in the form of a chain to the UFS device 6620.

Figure 11:
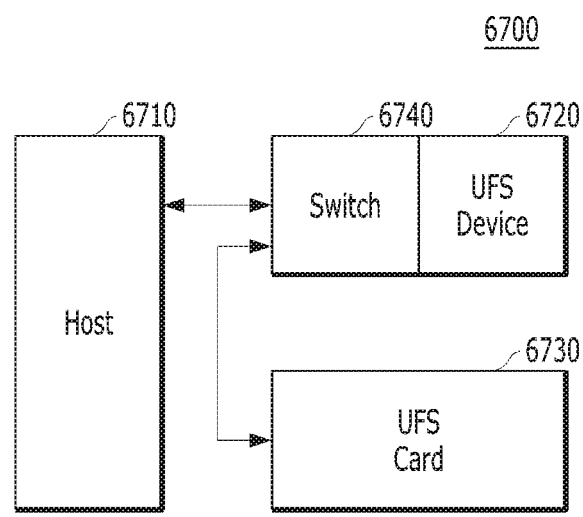

In the UFS system 6700 illustrated in FIG. 11, each of the host 6710, the UFS device 6720 and the UFS card 6730 may include UniPro, and the host 6710 may communicate with the UFS device 6720 or the UFS card 6730 through a switching module 6740 performing a switching operation, for example, through the switching module 6740 which performs link layer switching at the UniPro, for example, L3 switching. At this time, the UFS device 6720 and the UFS card 6730 may communicate with each other through link layer switching of the switching module 6740 at the UniPro, and the switching module 6740 may be integrated as one module with the UFS device 6720 inside or outside the UFS device 6720. In the present embodiment, the configuration in which one UFS device 6720 and one UFS card 6730 are connected to the switching module 6740 has been exemplified for convenience of description. However, a plurality of modules each including the switching module 6740 and the UFS device 6720 may be connected in parallel or in the form of a star to the host 6710 or connected in series or in the form of a chain to each other. Furthermore, a plurality of UFS cards may be connected in parallel or in the form of a star to the UFS device 6720.

Figure 12:
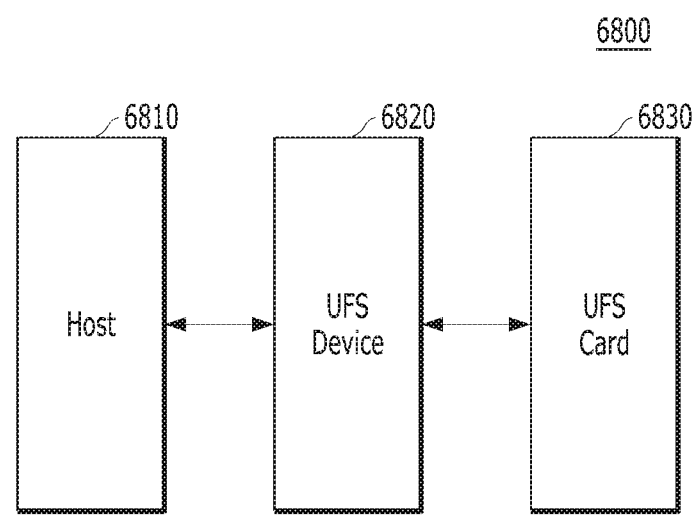

In the UFS system 6800 illustrated in FIG. 12, each of the host 6810, the UFS device 6820 and the UFS card 6830 may include M-PHY and UniPro. The UFS device 6820 may perform a switching operation in order to communicate with the host 6810 and the UFS card 6830. In particular, the UFS device 6820 may communicate with the host 6810 or the UFS card 6830 through a switching operation between the M-PHY and UniPro module for communication with the host 6810 and the M-PHY and UniPro module for communication with the UFS card 6830, for example, through a target ID (Identifier) switching operation. At this time, the host 6810 and the UFS card 6830 may communicate with each other through target ID switching between the M-PHY and UniPro modules of the UFS device 6820. In the present embodiment, the configuration in which one UFS device 6820 is connected to the host 6810 and one UFS card 6830 is connected to the UFS device 6820 has been exemplified for convenience of description. However, a plurality of UFS devices may be connected in parallel or in the form of a star to the host 6810, or connected in series or in the form of a chain to the host 6810, and a plurality of UFS cards may be connected in parallel or in the form of a star to the UFS device 6820, or connected in series or in the form of a chain to the UFS device 6820.

Figure 13:
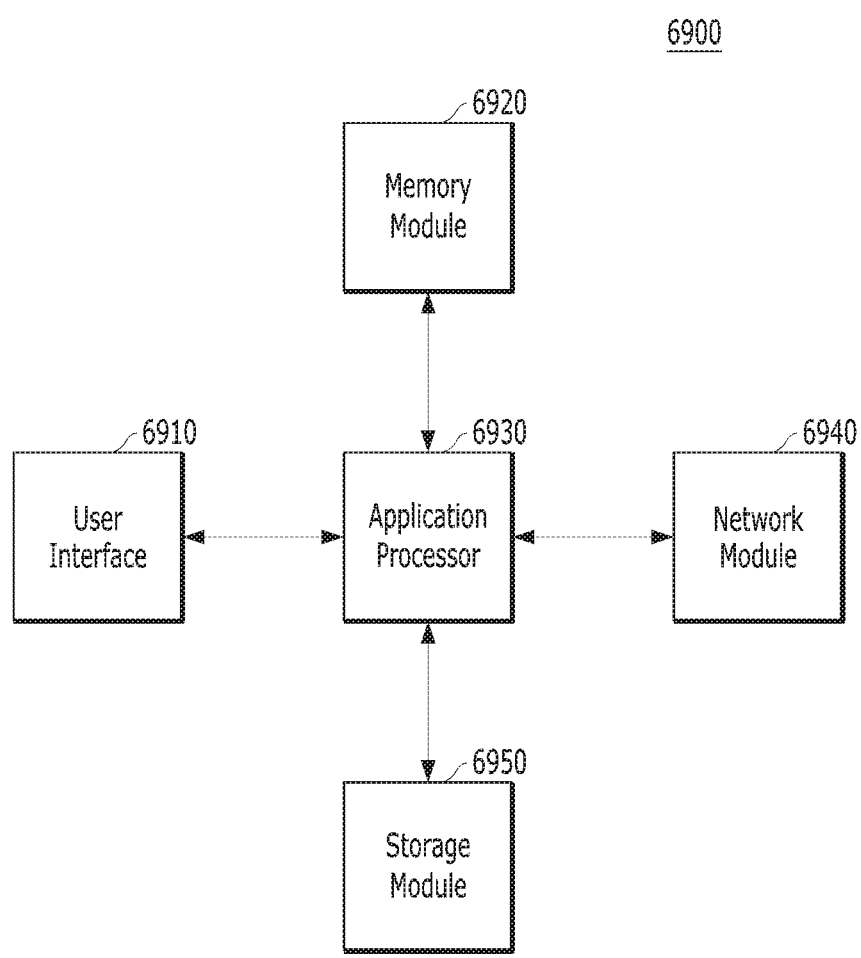

FIG. 13 is a diagram schematically illustrating another example of the data processing system including the memory system in accordance with an embodiment. FIG. 13 is a diagram schematically illustrating a user system to which the memory system in accordance with the present embodiment is applied.

Referring to FIG. 13, the user system 6900 may include an application processor 6930, a memory module 6920, a network module 6940, a storage module 6950 and a user interface 6910.

More specifically, the application processor 6930 may drive components included in the user system 6900, for example, an OS, and include controllers, interfaces and a graphic engine which control the components included in the user system 6900. The application processor 6930 may be provided as System-on-Chip (SoC).

The memory module 6920 may be used as a main memory, work memory, buffer memory or cache memory of the user system 6900. The memory module 6920 may include a volatile RAM such as DRAM, SDRAM, DDR SDRAM, DDR2 SDRAM, DDR3 SDRAM, LPDDR SDARM, LPDDR3 SDRAM or LPDDR3 SDRAM or a nonvolatile RAM such as PRAM, ReRAM, MRAM or FRAM. For example, the application processor 6930 and the memory module 6920 may be packaged and mounted, based on POP (Package on Package).

The network module 6940 may communicate with external devices. For example, the network module 6940 may not only support wired communication, but also support various wireless communication protocols such as code division multiple access (CDMA), global system for mobile communication (GSM), wideband CDMA (WCDMA), CDMA-2000, time division multiple access (TDMA), long term evolution (LTE), worldwide interoperability for microwave access (Wimax), wireless local area network (WLAN), ultra-wideband (UWB), Bluetooth, wireless display (WI-DI), thereby communicating with wired/wireless electronic devices or particularly mobile electronic devices. Therefore, the memory system and the data processing system, in accordance with an embodiment of the present invention, can be applied to wired/wireless electronic devices. The network module 6940 may be included in the application processor 6930.

The storage module 6950 may store data, for example, data received from the application processor 6930, and then may transmit the stored data to the application processor 6930. The storage module 6950 may be embodied by a nonvolatile semiconductor memory device such as a phase-change RAM (PRAM), a magnetic RAM (MRAM), a resistive RAM (ReRAM), a NAND flash, NOR flash and 3D NAND flash, and provided as a removable storage medium such as a memory card or external drive of the user system 6900. The storage module 6950 may correspond to the memory system 110 described with reference to FIGS. 1 and 2. Furthermore, the storage module 6950 may be embodied as an SSD, eMMC and UFS as described above with reference to FIGS. 7 to 12.

The user interface 6910 may include interfaces for inputting data or commands to the application processor 6930 or outputting data to an external device. For example, the user interface 6910 may include user input interfaces such as a keyboard, a keypad, a button, a touch panel, a touch screen, a touch pad, a touch ball, a camera, a microphone, a gyroscope sensor, a vibration sensor and a piezoelectric element, and user output interfaces such as a liquid crystal display (LCD), an organic light emitting diode (OLED) display device, an active matrix OLED (AMOLED) display device, an LED, a speaker and a motor.

Furthermore, when the memory system 110 of FIGS. 1 and 2 is applied to a mobile electronic device of the user system 6900, the application processor 6930 may control overall operations of the mobile electronic device, and the network module 6940 may serve as a communication module for controlling wired/wireless communication with an external device. The user interface 6910 may display data processed by the processor 6930 on a display/touch module of the mobile electronic device, or support a function of receiving data from the touch panel.

In the present technology, since a data clock calibration operation may be directly performed in the interface terminal of a controller, it is possible to minimize intervention of firmware. Through this, a burden imposed on firmware due to the data clock calibration operation may be minimized.

Moreover, since the phase of a data clock is not calibrated in a memory device and is calibrated in only the controller, the complexity of the data clock calibration operation may be minimized.

Although various embodiments have been described for illustrative purposes, it will be apparent to those skilled in the art that various changes and modifications may be made without departing from the spirit and scope of the invention as defined in the following claims.

What is claimed is:

1. A memory system comprising:
    a controller configured to generate a first data clock and a first data pattern and recognize a second data clock and a second data pattern; and
    a non-volatile memory device, including a memory block storing the second data pattern, configured to generate the second data clock and the second data pattern and recognize the first data clock and the first data pattern,
    wherein the non-volatile memory device is further configured to compare the first data pattern with the second data pattern in a write calibration mode to output a first comparison result to the controller, while the controller is further configured to compare the first data pattern with the second data pattern in a read calibration mode to generate a second comparison result, and
    wherein the controller is further configured to calibrate the first data clock and the second data clock based on the first and the second comparison results to perform data transmission with the memory device.

2. The memory system according to claim 1, wherein the first data clock having a first phase difference from a reference clock is used for transmitting data from the controller to the memory device, and the second data clock having a second phase difference from the reference clock is used for transmitting data from the memory device to the controller.

3. The memory system according to claim 2, wherein the first phase difference is different from the second phase difference.

4. The memory system according to claim 1, wherein the write calibration mode and the read calibration mode are performed either in a booting operation or in response to a bit-flip error.

5. The memory system according to claim 1, wherein the write calibration mode and the read calibration mode are selectively performed in response to the first comparison result and the second comparison result.

6. The memory system according to claim 1, wherein the write calibration mode and the read calibration mode are performed during an idle state.

7. The memory system according to claim 1, wherein the first data pattern and the second data pattern are identical.

8. A memory system, comprising:
    a controller configured to control a first phase difference between a clock signal and a first data pattern and transmit the first data pattern with the first phase difference; and
    a plurality of non-volatile memory dies, each memory die configured to receive the first data pattern delivered via a channel and compare the first data pattern with a second data pattern stored in the memory die to output a first comparison result to the controller,
    wherein the controller is further configured to calibrate the first phase difference based on the first comparison result to perform first data transmission with the memory die.

9. The memory system according to claim 8, wherein the first data transmission includes controller's data transmission and non-volatile memory die's data reception.

10. The memory system according to claim 8, wherein the controller transmits a write calibration command to the non-volatile memory die before transmitting the first data pattern.

11. The memory system according to claim 8, wherein the non-volatile memory die configured to output a third data pattern with a second phase difference to the controller in response to a read calibration command,
    wherein the controller is further configured to compare the third data pattern and a fourth data pattern stored in the controller to output a second comparison result and to calibrate the second phase difference based on the second comparison result to perform second data transmission with the memory device.

12. The memory system according to claim 11, wherein the first data transmission includes controller's data transmission and non-volatile memory die's data reception.

13. The memory system according to claim 11, wherein the first phase difference is different from the second phase difference.

14. The memory system according to claim 11, wherein controller's bi-directional calibration for read and write operations is performed in a booting operation.

15. The memory system according to claim 11, wherein controller's calibration for read or write operation is selectively performed in response to a bit-flip error.

16. The memory system according to claim 11, wherein controller's calibration for read or write operation is performed during an idle state.

17. The memory system according to claim 11, wherein the first data pattern and the second data pattern are identical, and the third data pattern and the fourth data pattern are identical.

18. The memory system according to claim 11, wherein the first data pattern is different from the third data pattern.

19. A data processing system, comprising:
 a host configured to control a first phase difference between a clock signal and a first data pattern and transmit the first data pattern with the first phase difference; and
 a memory system including a controller and a non-volatile memory device, wherein the controller is configured to receive the first data pattern delivered via a channel and compare the first data pattern with a second data pattern stored in the non-volatile memory device to output a first comparison result to the host so that the host calibrates the first phase difference based on the first comparison result to perform first data transmission with the memory system.

20. The data processing system according to claim 19, wherein the host transmits a write calibration command to the memory system before transmitting the first data pattern either in a booting operation, in response to a bit-flip error or in an idle state.

* * * * *